(12) United States Patent
Hasegawa

(10) Patent No.: US 6,952,328 B2
(45) Date of Patent: Oct. 4, 2005

(54) MAGNETIC SENSING ELEMENT HAVING SECOND ANTIFERROMAGNETIC LAYER ON EDGE SECTIONS AND REAR END OF A MIDDLE SECTION OF FREE MAGNETIC LAYER

(75) Inventor: Naoya Hasegawa, Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 10/389,412

(22) Filed: Mar. 14, 2003

(65) Prior Publication Data

US 2003/0179520 A1 Sep. 25, 2003

(30) Foreign Application Priority Data

Mar. 20, 2002 (JP) ........................................ 2002-077749

(51) Int. Cl.[7] ................................................ G11B 5/39
(52) U.S. Cl. .............................. 360/234.12; 360/324.2
(58) Field of Search ......................... 360/324.12, 324.2

(56) References Cited

U.S. PATENT DOCUMENTS

| | | | |
|---|---|---|---|
| 6,040,961 A | 3/2000 | Gill | |
| 6,219,211 B1 | 4/2001 | Gill | |
| 6,466,419 B1 * | 10/2002 | Mao | 360/324.12 |
| 6,700,760 B1 * | 3/2004 | Mao | 360/324.2 |
| 2003/0035256 A1 * | 2/2003 | Hayashi et al. | 360/324.12 |

* cited by examiner

Primary Examiner—Craig A. Renner
(74) Attorney, Agent, or Firm—Brinks Hofer Gilson & Lione

(57) ABSTRACT

A CPP type magnetic sensing element capable of properly performing magnetization control of a free magnetic layer and having small hysteresis and an excellent playback characteristic, as well as a manufacturing method therefor, are provided. Second antiferromagnetic layers are provided not only on both edge sections of the free magnetic layer, but also on the middle rear end. In the height-side edge of the middle front end of the aforementioned free magnetic layer, a sense current magnetic field in the direction opposite to the magnetization direction of the aforementioned free magnetic layer is cancelled by a bias magnetic field from the second antiferromagnetic layer provided on the middle rear end. Consequently, an influence of the aforementioned sense current magnetic field can be reduced, turbulence in the magnetization of the aforementioned free magnetic layer can be made smaller than ever, and a magnetic sensing element having small hysteresis can be manufactured.

18 Claims, 25 Drawing Sheets

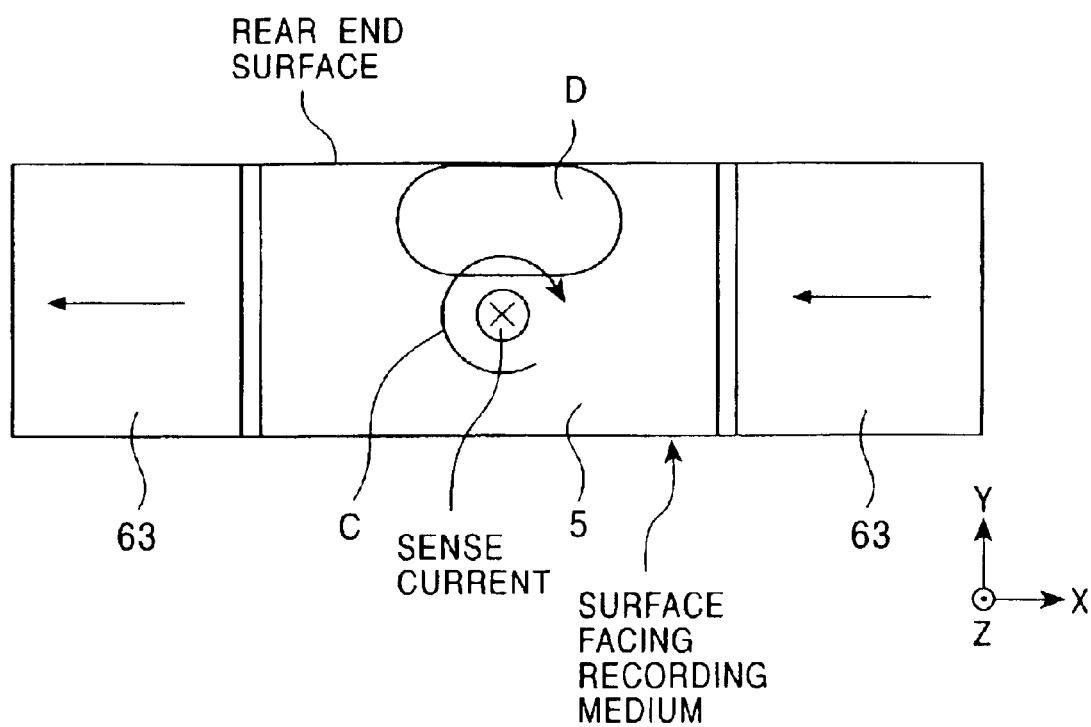

MAGNETIC SENSING ELEMENT HAVING SECOND ANTIFERROMAGNETIC LAYER ON EDGE SECTIONS AND REAR END OF A MIDDLE SECTION OF FREE MAGNETIC LAYER

This application claims the benefit of priority to Japanese Patent Application 2002-077749, filed on Mar. 20, 2002.

BACKGROUND OF THE INVENTION

1. Field of the Invention

The present invention relates to a CPP (current perpendicular to the plane) type magnetic sensing element. In particular, the present invention relates to a magnetic sensing element capable of properly performing magnetization control of a free magnetic layer.

2. Description of the Related Art

FIG. 31 is a partial sectional view of the structure of a conventional magnetic sensing element, viewed from the side of the surface facing a recording medium.

Reference numeral 1 denotes a lower electrode, and a first antiferromagnetic layer 2 made of PtMn or the like is arranged on the aforementioned lower electrode 1. A pinned magnetic layer 8 formed from CoFe or the like is further arranged on the aforementioned first antiferromagnetic layer 2, a non-magnetic material layer 4 formed from Cu or the like is arranged on the aforementioned pinned magnetic layer 8, and a free magnetic layer 5 formed from NiFe or the like is further arranged on the aforementioned non-magnetic material layer 4. Second antiferromagnetic layers 6 formed from PtMn or the like are arranged on both edge sections in the track-width direction (the X direction shown in the drawing) of the aforementioned free magnetic layer 5. As shown in FIG. 31, an upper electrode 7 is arranged on the aforementioned free magnetic layer 5 and the second antiferromagnetic layers 6. Insulating layers 9 are inserted between the second antiferromagnetic layers 6 and the upper electrode 7.

Magnetization of the aforementioned pinned magnetic layer 8 is pinned in the Y direction shown in the drawing by an exchange coupling magnetic field between the pinned magnetic layer 8 and the aforementioned first antiferromagnetic layer 2. On the other hand, magnetization of both the edge sections of the aforementioned free magnetic layer 5 is pinned in the direction opposite to the X direction shown in the drawing by an exchange coupling magnetic field generated between the edge sections of the free magnetic layer 5 and the second antiferromagnetic layer 6 arranged thereon. However, magnetization of the middle section of the aforementioned free magnetic layer 5 is weakly brought into the condition of a single domain, so that magnetic reversal can be brought about with respect to an external magnetic field.

The magnetic sensing element shown in FIG. 31 is referred to as a CPP (current perpendicular to the plane) type magnetic sensing element, in which the current flowing from the electrodes 1 and 7 passes through the multilayer film from the first antiferromagnetic layer 2 to the free magnetic layer 5 in the film thickness direction (the Z direction shown in the drawing).

The playback output of the CPP type magnetic sensing element can be increased by reduction in the element size compared with that of a CIP (current in the plane) type magnetic sensing element in which the current flowing from electrodes passes through the multilayer film from the first antiferromagnetic layer 2 to the free magnetic layer 5 in the direction parallel to the film surfaces (the X direction shown in the drawing). Consequently, the CPP type was expected to be able to appropriately respond to the reduction in the element size with a future increase in a packing density.

However, regarding the magnetic sensing element shown in FIG. 31, the following problems were pointed out.

FIG. 32 is a partial plan view of portions of the free magnetic layer 5 shown in FIG. 31 and the second antiferromagnetic layer 6 arranged thereon, viewed from directly above.

As shown in FIG. 32, when it is assumed that sense current flows into the central portion of the aforementioned free magnetic layer 5 in the direction opposite to the Z direction shown in the drawing (that is, in the downward direction perpendicular to the paper surface), a sense current magnetic field C is generated following the corkscrew rule at this time. The direction of the aforementioned sense current magnetic field C in a region E on the side of the surface facing a recording medium agrees with the magnetization direction of the free magnetic layer 5 (the direction parallel to the X direction shown in the drawing and the leftward direction in the drawing), and therefore, no problem occurs. However, the direction of the sense current magnetic field in a region D on the back side of the surface facing the recording medium, that is, the rear end surface side, is opposite in direction to the magnetization direction of the aforementioned free magnetic layer 5 (the direction parallel to the X direction shown in the drawing and the rightward direction in the drawing). Therefore, the magnetization of the aforementioned free magnetic layer 5 is likely to be disturbed in this region, and by extension, magnetization control of the total element is hindered.

Since the CPP type magnetic sensing element has a small element resistance, a large playback output cannot be attained unless the sense current density is increased. However, the influence of the aforementioned turbulence in the magnetization of the free magnetic layer 5 is increased with an increase in the aforementioned sense current density. Consequently, hysteresis is exhibited, and degradation of the playback characteristic is brought about.

The aforementioned problems also occur in the case where the magnetization of the aforementioned free magnetic layer 5 is controlled by hard bias layers 63 made of a permanent magnet, arranged on both sides of the aforementioned free magnetic layer 5, in contrast to the magnetic sensing element shown in FIG. 31 and FIG. 32.

FIG. 33 is a partial sectional view of the structure of a magnetic sensing element, in which the magnetization control of the aforementioned free magnetic layer 5 is performed by hard bias layers 63, viewed from the side of the surface facing a recording medium. FIG. 34 is a partial plan view of the aforementioned free magnetic layer 5 and the hard bias layers 63 arranged on both sides thereof, viewed from directly above.

In this magnetic sensing element, a substrate layer 61, a free magnetic layer 4, a non-magnetic material layer 5, a pinned magnetic layer 8, a first antiferromagnetic layer 2 and a protective layer 62 are laminated on a lower electrode 1 in that order. The hard bias layers 63 are oppositely arranged on both sides in the track-width direction (the X direction shown in the drawing) of the aforementioned free magnetic layer 5, and insulating layers 60 formed from $Al_2O_3$ or the like are arranged above and under the aforementioned hard bias layers 63.

As shown in FIG. 34, when sense current flows through the aforementioned free magnetic layer 5 in the direction opposite to the Z direction shown in the drawing (that is, in the downward direction perpendicular to the paper surface), a sense current magnetic field C is generated following the corkscrew rule. Consequently, the free magnetic layer 5 magnetized in the direction parallel to the X direction shown in the drawing and the leftward direction in the drawing is affected by the aforementioned sense current magnetic field being directed in the direction opposite to the magnetization direction of the aforementioned free magnetic layer 5 in a region D on the rear end surface side, and therefore, the magnetization of the aforementioned free magnetic layer 5 is disturbed.

When the magnetization control of the aforementioned free magnetic layer 5 is performed using the hard bias layers 63, the aforementioned problems can be alleviated by increasing the film thickness of the aforementioned hard bias layer 63, and thereby enhancing a vertical bias magnetic field in the leftward direction shown in the drawing, which flows into the aforementioned free magnetic layer 5. However, since the aforementioned vertical bias magnetic field becomes excessively strong, the magnetization of the aforementioned free magnetic layer 5 becomes likely to be pinned. Therefore, highly sensitive magnetic reversal is not brought about with respect to an external magnetic field, and a problem of degradation of the playback characteristic occurs.

The aforementioned problem occurs in the case of not only the structure of a magnetic sensing element in which the non-magnetic material layer 4 of the aforementioned magnetic sensing element is formed from a non-magnetic conductive material, for example, Cu, but also the structure of a magnetic sensing element in which the aforementioned non-magnetic material layer 4 is formed from an insulating layer of $Al_2O_3$ or the like. A magnetic sensing element having such a structure is referred to as a tunneling magnetoresistance effect type element.

SUMMARY OF THE INVENTION

The present invention was made to overcome the aforementioned problems. Accordingly, it is an object of the present invention to provide a magnetic sensing element having small hysteresis and an excellent playback characteristic, in which the arrangement position of the second antiferromagnetic layer is in particular optimized, and turbulence in the magnetization of a free magnetic layer due to a sense current magnetic field is thereby alleviated.

In a magnetic sensing element according to an aspect of the present invention, a multilayer film including a first antiferromagnetic layer, a pinned magnetic layer, a non-magnetic material layer and a free magnetic layer in that order from the bottom is provided, electrodes are provided above and under the aforementioned multilayer film, and electric current flows in the direction perpendicular to a film surface of each layer of the aforementioned multilayer film. Furthermore, in the magnetic sensing element, second antiferromagnetic layers are provided on both edge sections in the track-width direction of the aforementioned free magnetic layer and on the rear end of the middle section in the track-width direction of the aforementioned free magnetic layer, and an upper electrode is provided on the front end of the aforementioned middle section of the aforementioned free magnetic layer.

In this aspect of the present invention, the second antiferromagnetic layers are provided not only on both edge sections in the track-width direction of the aforementioned free magnetic layer, but also on the rear end of the middle section (hereafter referred to as the middle rear end) in the track-width direction of the aforementioned free magnetic layer.

In this manner, the vicinity of the height-side edge of the front end of the middle section (hereafter referred to as the middle front end) in the track-width direction of the aforementioned free magnetic layer is affected by a strong bias magnetic field from the aforementioned middle rear end.

On the other hand, since sense current flows through the middle front end of the aforementioned free magnetic layer in the film thickness direction, a sense current magnetic field is generated. In particular, this sense current magnetic field is enhanced with increasing proximity to each edge of the middle front end of the aforementioned free magnetic layer.

In this aspect of the present invention, as described above, the sense current magnetic field being directed in the direction opposite to the magnetization direction of the aforementioned free magnetic layer is canceled by the bias magnetic field from the second antiferromagnetic layer provided on the middle rear end of the free magnetic layer in the height-side edge of the middle front end of the aforementioned free magnetic layer, and therefore, an influence of the aforementioned sense current magnetic field can be reduced. Consequently, turbulence in the magnetization of the free magnetic layer can be made smaller than ever, and therefore, the magnetization control of the aforementioned free magnetic layer can be properly performed. As is clear from the experiments described below, the magnetic sensing element according to this aspect of the present invention has small hysteresis and an excellent playback characteristic compared with those of the magnetic sensing element having a conventional structure in which bias layers are provided simply on both sides of the free magnetic layer (FIG. 33 and FIG. 34).

In this aspect of the present invention, preferably, the aforementioned second antiferromagnetic layers provided on the aforementioned both edge sections and on the aforementioned middle rear end are integrally arranged.

In this aspect of the present invention, preferably, an insulating layer is provided on the aforementioned second antiferromagnetic layer, and the aforementioned upper electrode is arranged over the aforementioned insulating layer and the aforementioned middle front end of the aforementioned free magnetic layer. In this manner, the current flowing between the aforementioned upper electrode and the lower electrode can be prevented from being diverted into the aforementioned second antiferromagnetic layer, and a magnetic sensing element having a large playback output can be manufactured.

In this aspect of the present invention, preferably, the aforementioned insulating layer is arranged extending onto a part of the aforementioned middle front end of the aforementioned free magnetic layer, and the aforementioned upper electrode is arranged over the aforementioned insulating layer and the aforementioned middle front end of the aforementioned free magnetic layer, not covered with the aforementioned insulating layer. That is, in this condition, the aforementioned insulating layer overlaps the aforementioned middle front end of the aforementioned free magnetic layer, and the surface of the aforementioned second antiferromagnetic layer is completely covered with the aforementioned insulating layer. In this manner, diversion of the current into the aforementioned second antiferromagnetic layer can be further properly prevented, and a magnetic sensing element having a large playback output can be manufactured.

In a magnetic sensing element according to another aspect of the present invention, a multilayer film including a first antiferromagnetic layer, a pinned magnetic layer, a non-magnetic material layer and a free magnetic layer is provided, electrodes are provided above and under the aforementioned multilayer film, and electric current flows in the direction perpendicular to a film surface of each layer of the aforementioned multilayer film. Furthermore, in the magnetic sensing element, bias layers are provided facing both the edge surfaces in the track-width direction of the aforementioned free magnetic layer and the rear end surface in the height direction, the aforementioned bias layer provided on the aforementioned rear end surface side is arranged in contact with the rear end surface of the aforementioned free magnetic layer, and an upper electrode is provided on the aforementioned free magnetic layer.

In this aspect of the present invention, the bias layers are provided facing not only both the edge surfaces in the track-width direction of the aforementioned free magnetic layer, but also the rear end surface side of the aforementioned free magnetic layer. In particular, it is notable that this bias layer is arranged in contact with the rear end surface of the aforementioned free magnetic layer.

Since an exchange interaction occurs between the rear end surface of the aforementioned free magnetic layer and the bias layer, pinning of the magnetization is enhanced in the vicinity of the rear end surface of the aforementioned free magnetic layer.

On the other hand, since sense current flows through the aforementioned free magnetic layer in the film thickness direction, a sense current magnetic field is generated. In particular, this sense current magnetic field is enhanced with increasing proximity to the outer edge of the aforementioned free magnetic layer. In this aspect of the present invention, as described above, since resistance of the magnetization to moving with respect to a magnetic field in the direction opposite to the magnetization direction of the free magnetic layer can be increased in the vicinity of the rear end surface of the aforementioned free magnetic layer, the influence of the aforementioned sense current magnetic field can be reduced in the vicinity of the rear end surface of the aforementioned free magnetic layer, turbulence in the magnetization of the aforementioned free magnetic layer can be made smaller than ever, and the magnetization control of the aforementioned free magnetic layer can be properly performed.

In this aspect of the present invention, preferably, the aforementioned bias layers provided on the aforementioned both edge surfaces and on the aforementioned rear end surface are integrally arranged.

In this aspect of the present invention, preferably, an insulating layer is provided on the aforementioned bias layers, and the aforementioned upper electrode is arranged over the aforementioned insulating layer and the aforementioned free magnetic layer. In this manner, the current flowing between the aforementioned upper electrode and the lower electrode can be prevented from being diverted into the second antiferromagnetic layer, and a magnetic sensing element having a large playback output can be manufactured.

In this aspect of the present invention, preferably, the aforementioned non-magnetic material layer is formed from a non-magnetic conductive material, or is formed from an insulating material.

In this aspect of the present invention, preferably, the lower electrode arranged under the aforementioned multilayer film is a lower shield layer, and the upper electrode arranged above the multilayer film is an upper shield layer. In this manner, there is no need to provide any electrode layer other than the aforementioned shield layers, the gap length Gl between the lower shield layer to the upper shield layer can be reduced, and a magnetic sensing element capable of properly responding to an increase in the packing density can be manufactured.

BRIEF DESCRIPTION OF THE DRAWINGS

FIG. 34 is a partial plan view of the free magnetic layer and the hard bias layers shown in FIG. 33, viewed from directly above.

DESCRIPTION OF THE PREFERRED EMBODIMENTS

Figure 1:
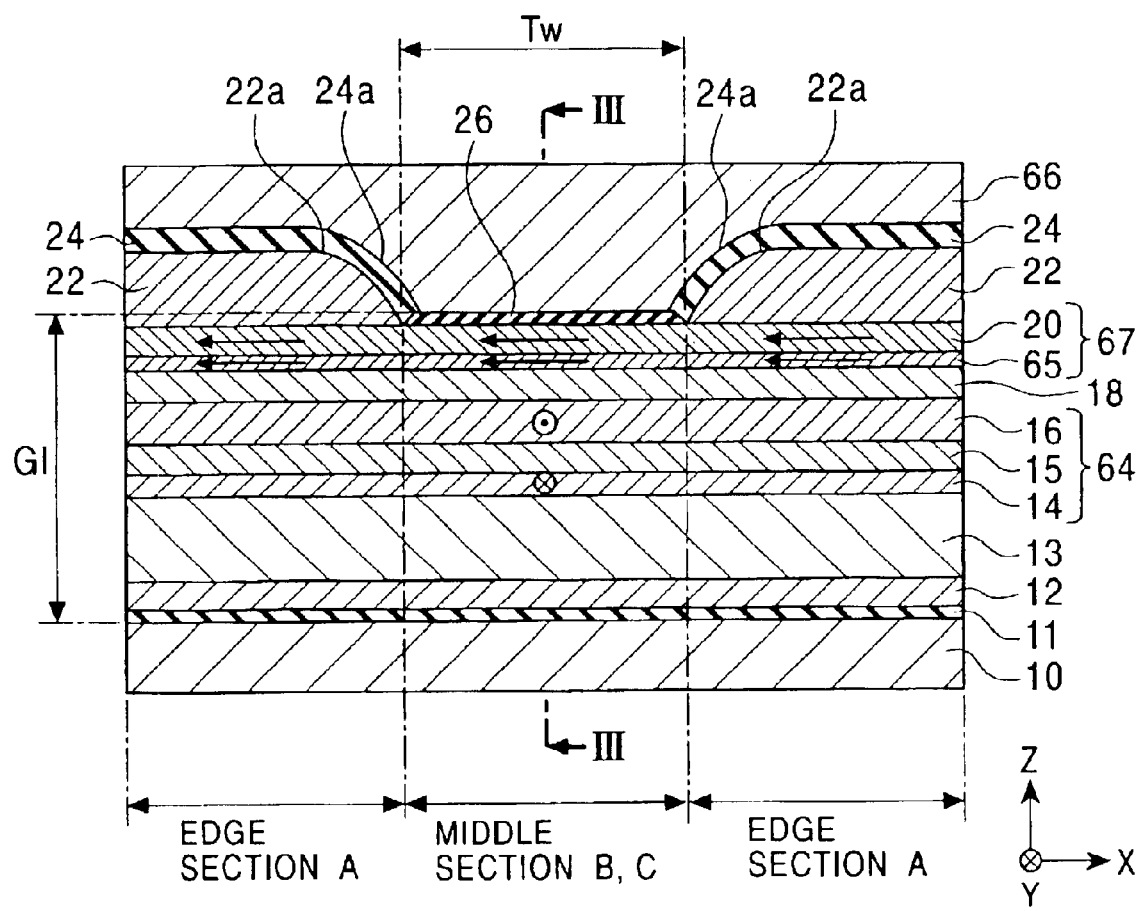
FIG. 1 is a partial sectional view of a magnetic sensing element according to a first embodiment of the present invention, viewed from the side of the surface facing a recording medium.

FIG. 1 is a partial sectional view of the total structure of a magnetic sensing element according to the first embodiment of the present invention, viewed from the side of the surface facing a recording medium. FIG. 1 simply shows a cutaway central portion of the element extending in the X direction.

The magnetic sensing element shown in FIG. 1 is provided in order to perform playback based on signals recorded on a recording medium. Although not shown in the drawing, an inductive head for recording may be laminated on this magnetic sensing element.

The aforementioned magnetic sensing element is formed on a trailing edge surface of a slider formed from, for example, alumina-titanium carbide ($Al_2O_3$—TiC). The aforementioned slider is joined to an elastically deformable support made of stainless steel or the like on the side of the surface opposite to the surface facing the recording medium, and therefore, a magnetic head device is constructed.

In FIG. 1, reference numeral 10 denotes a lower shield layer formed from a magnetic material, for example, a NiFe alloy. The aforementioned lower shield layer 10 also serves as an lower electrode in the present embodiment.

A substrate layer 11 formed from a non-magnetic material is arranged on the aforementioned lower shield layer 10. The aforementioned substrate layer 11 also serves as a lower gap layer. The aforementioned substrate layer 11 is preferably formed from at least one selected from the group consisting of Ta, Hf, Nb, Zr, Ti, Mo and W. The aforementioned substrate layer 11 is formed to have a film thickness in the order of 50 angstroms or less, for example.

A seed layer 12 is formed on the aforementioned substrate layer 11. Since the aforementioned seed layer 12 is arranged, a crystal particle diameter can be increased in the direction parallel to a film surface of each layer formed on the aforementioned seed layer 12, and therefore, an improvement in reliability of energization typified by an improvement in electromigration resistance, an improvement in a rate of change of resistance ($\Delta R/R$) and the like can be further properly achieved.

The aforementioned seed layer 12 is formed from a NiFe alloy, a NiFeCr alloy, Cr or the like. When the aforementioned seed layer 12 is formed from NiFeCr, for example, the compositional ratio thereof is $(Ni_{0.8}Fe_{0.2})_{60 at\%}Cr_{40 at\%}$. The aforementioned seed layer 12 is formed to have a film thickness on the order of 30 angstroms or less, for example. The aforementioned seed layer 12 may not be present.

A first antiferromagnetic layer 13 is formed on the aforementioned seed layer 12. Preferably, the aforementioned first antiferromagnetic layer 13 is formed from an antiferromagnetic material containing an element X (where X is at least one element selected from the group consisting of Pt, Pd, Ir, Rh, Ru and Os) and Mn. Alternatively, the aforementioned first antiferromagnetic layer 13 is preferably formed from an antiferromagnetic material containing the element X, an element X' (where X' is at least one element selected from the group consisting of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Sn, Hf, Ta, W, Re, Au, Pb and rare-earth elements) and Mn.

These antiferromagnetic materials have excellent corrosion resistance and, furthermore, a high blocking temperature, and can generate a large exchange-anisotropic magnetic field at the interface to a second magnetic layer 14 constituting a pinned magnetic layer 64 described below. Preferably, the aforementioned first antiferromagnetic layer 13 is formed to have a film thickness of 80 angstroms or more, but 300 angstroms or less.

The pinned magnetic layer 64 is arranged on the aforementioned first antiferromagnetic layer 13. The pinned magnetic layer 64 is formed to have a three-layer structure in the present embodiment.

Layers denoted by reference numerals 14 and 16 are magnetic layers constituting the aforementioned pinned magnetic layer 64. A non-magnetic intermediate layer 15 formed from Ru or the like is interposed between the aforementioned second magnetic layer 14 and first magnetic layer 16. By this configuration, the magnetization directions of the aforementioned second magnetic layer 14 and first magnetic layer 16 are brought into a condition of being antiparallel to each other. This is referred to as a so-called laminated ferrimagnetic structure. In the present specification, a magnetic layer on the side in contact with a non-magnetic material layer 18 is referred to as the first magnetic layer, and the other magnetic layer is referred to as the second magnetic layer in the laminated ferrimagnetic structure. The aforementioned non-magnetic intermediate layer 15 is formed from at least one selected from the group consisting of Ru, Rh, Ir, Cr, Re and Cu, or an alloy of at least two thereof. In particular, the aforementioned non-magnetic intermediate layer 15 is preferably formed from Ru.

An exchange-anisotropic magnetic field is generated between the aforementioned first antiferromagnetic layer 13 and the second magnetic layer 14 of the aforementioned pinned magnetic layer 64 in contact with the aforementioned first antiferromagnetic layer 13 by a magnetic heat treatment. For example, when the magnetization of the aforementioned second magnetic layer 14 is pinned in the height direction (the Y direction shown in the drawing), in contrast to this, the first magnetic layer 16 is magnetized, followed by pinning, in the direction opposite to the height direction (the direction opposite to the Y direction shown in the drawing) by an RKKY interaction. The magnetization of the aforementioned pinned magnetic layer 64 can be brought into a stabilized condition by this configuration, and in addition, the exchange-anisotropic magnetic field generated at the interface between the second magnetic layer 14 of the aforementioned pinned magnetic layer 64 and the aforementioned first antiferromagnetic layer 13 can be apparently increased.

For example, the aforementioned magnetic layers 14 and 16 are formed to have film thicknesses in the order of 10 to 70 angstroms, and the non-magnetic intermediate layer is formed to have a film thickness of 3 to 10 angstroms.

The aforementioned second magnetic layer 14 and the first magnetic layer 16 have magnetic moments on a unit area basis different from each other. The aforementioned magnetic moment is specified by saturation magnetization Ms×film thickness t. When the magnetic moment of the aforementioned second magnetic layer 14 is differentiated from that of the first magnetic layer 16, the second magnetic layer 14 and the first magnetic layer 16 are allowed to properly constitute a laminated ferrimagnetic structure.

The non-magnetic material layer 18 is arranged on the aforementioned pinned first magnetic layer 16. The aforementioned non-magnetic material layer 18 is formed from a conductive material, for example, Cu, having a low electrical resistance. The aforementioned non-magnetic material layer 18 is formed to have a film thickness on the order of 25 angstroms, for example.

A free magnetic layer 67 is formed on the aforementioned non-magnetic material layer 18. The aforementioned free magnetic layer 67 is formed to have a two-layer structure of magnetic layers in the present embodiment. Preferably, the aforementioned free magnetic layer 67 is formed to have a total film thickness on the order of 20 angstroms or more, but 100 angstroms or less.

Preferably, the magnetic layers 65 and 20 constituting the aforementioned free magnetic layer 67 are formed from any one of a CoFe alloy, a CoFeNi alloy, a NiFe alloy and Co. More preferably, the magnetic layer 65 is formed from a CoFe alloy, and the magnetic layer 20 is formed from a NiFe alloy.

Figure 2:
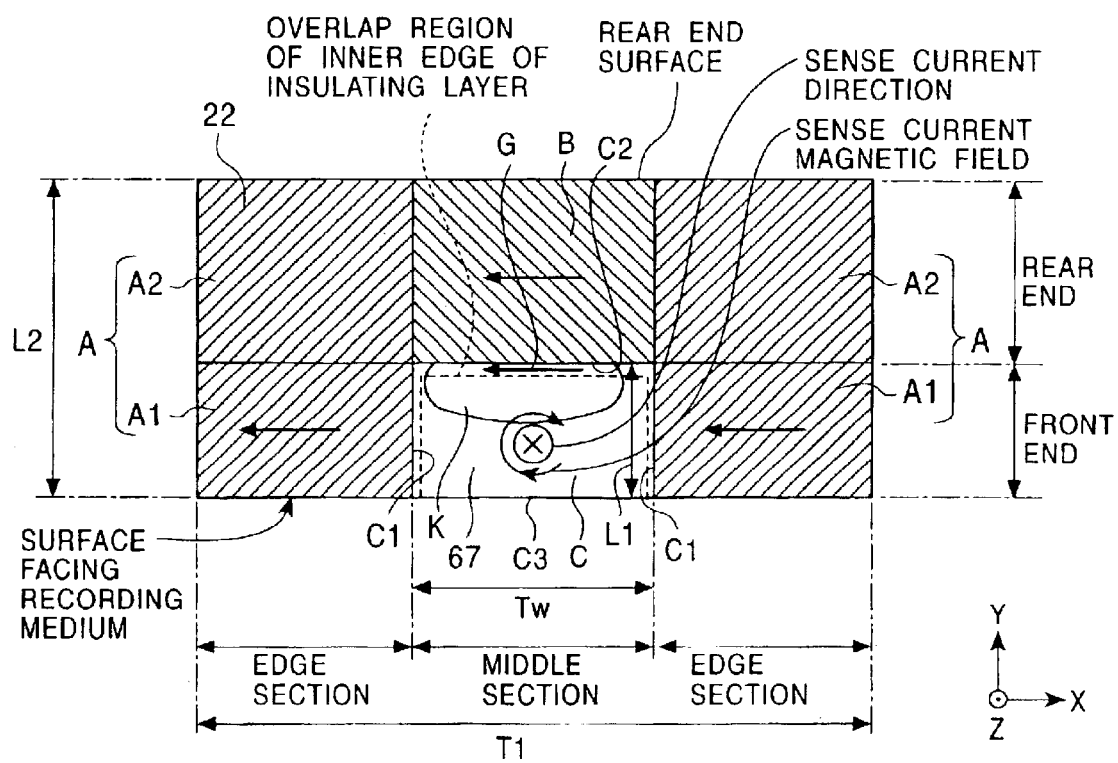
FIG. 2 is a partial plan view of the free magnetic layer and the second antiferromagnetic layers of the magnetic sensing element shown in FIG. 1, viewed from directly above.
Figure 3:
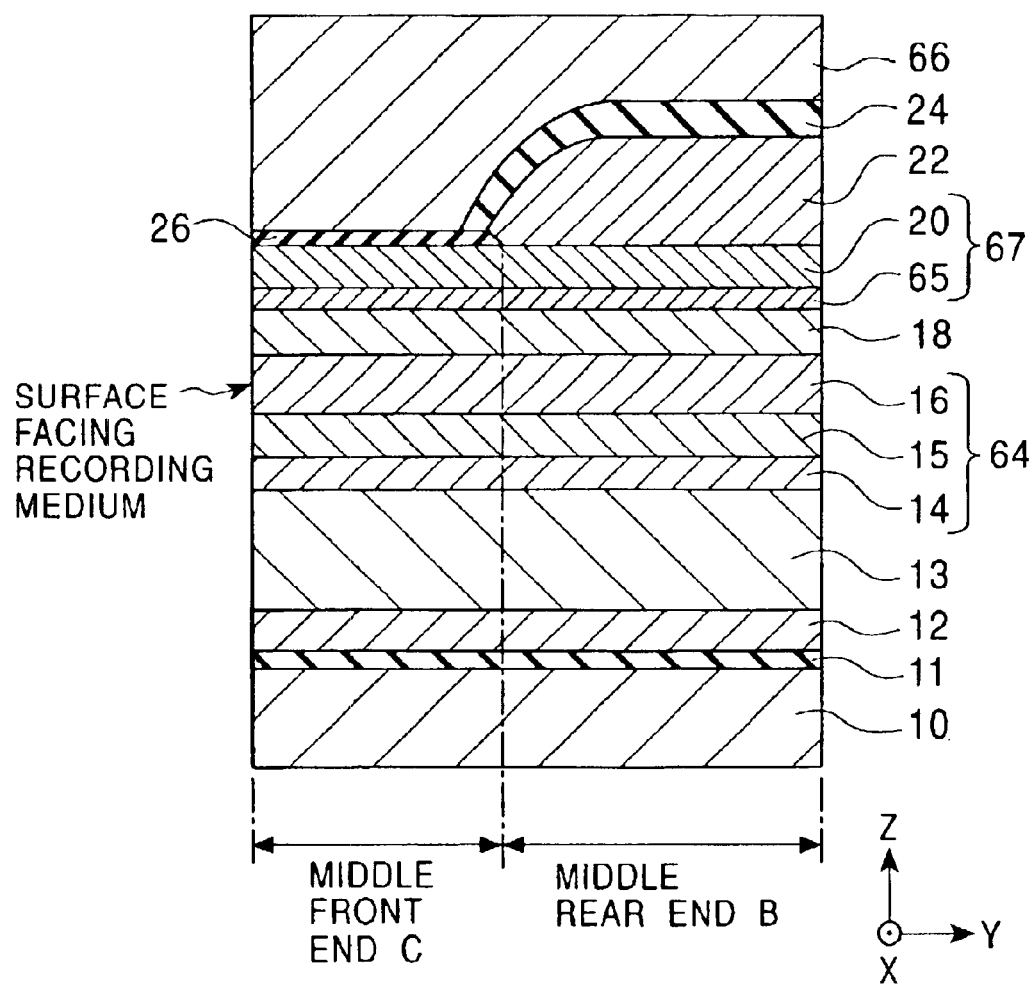
FIG. 3 is a partial vertical sectional view of the magnetic sensing element cut from the line III—III to the height direction shown in FIG. 1, viewed from the direction indicated by arrows.

As shown in FIG. 1, a non-magnetic layer 26 is arranged on the aforementioned free magnetic layer 67. The aforementioned non-magnetic layer 26 is arranged simply on a front end C of the middle section (hereafter referred to as a middle front end C) in the track-width direction (the X direction shown in the drawing) of the free magnetic layer 67 shown in FIG. 2. FIG. 3 also shows that the aforementioned non-magnetic layer 26 is arranged simply on the middle front end C of the free magnetic layer 67, while FIG. 3 is a partial vertical sectional view of the middle section of the free magnetic layer of the magnetic sensing element cut from the line III—III to the height direction (the Y direction shown in the drawing) shown in FIG. 1, viewed from the direction indicated by arrows. Here, a "front end" refers to a region on the side of the surface facing a recording medium in the direction parallel to the height direction (the Y direction shown in the drawing).

The aforementioned non-magnetic layer 26 is preferably formed from at least one selected from the group consisting of Ru, Re, Pd, Os, Ir, Pt, Au and Rh.

As shown in FIG. 1, second antiferromagnetic layers 22 are arranged on both edge sections A of the aforementioned free magnetic layer 67. As shown in FIGS. 2 and 3, this second antiferromagnetic layer 22 is also arranged on a rear end B of the middle section (hereafter referred to as a middle rear end B) of the aforementioned free magnetic layer 67. Here, a "rear end" refers to a region on the back side of the surface facing a recording medium in the direction parallel to the height direction (the Y direction shown in the drawing), that is, on the rear end surface side.

Preferably, the aforementioned second antiferromagnetic layer 22 is formed from an antiferromagnetic material containing an element X (where X is at least one element selected from the group consisting of Pt, Pd, Ir, Rh, Ru and Os) and Mn. Alternatively, the aforementioned second antiferromagnetic layer 22 is preferably formed from an antiferromagnetic material containing the element X, an element X' (where X' is at least one element selected from the group consisting of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Sn, Hf, Ta, W, Re, Au, Pb and rare-earth elements) and Mn.

When an exchange coupling magnetic field is generated between the aforementioned second antiferromagnetic layer 22 and the free magnetic layer 67, the magnetization of both the edge sections A and middle rear end B of the aforementioned free magnetic layer 67 is pinned in the direction parallel to the track-width direction (the X direction shown in the drawing). In the present embodiment, the free magnetic layer 67 is magnetized in, for example, the leftward direction in the drawing. On the other hand, the magnetization of the middle front end C of the aforementioned free magnetic layer 67 is weakly brought into the condition of a single domain, so that magnetic reversal can be brought about with respect to an external magnetic field.

An insulating layer 24 formed from an insulating material, for example, $Al_2O_3$ and $SiO_2$, is arranged on the aforementioned second antiferromagnetic layer 22. Consequently, the aforementioned insulating layer 24 is formed on both the edge sections A and middle rear end B of the free magnetic layer 67 shown in FIG. 2.

In the embodiment shown in FIGS. 1 and 2, an upper shield layer 66 is formed over the aforementioned insulating layer 24 and the middle front end C of the free magnetic layer 67. The aforementioned upper shield layer 66 is formed from a magnetic material, for example, a NiFe alloy. In the present embodiment, the aforementioned upper shield layer 66 has a function as an upper electrode, and the aforementioned non-magnetic layer 26 has a function as an upper gap layer.

In the magnetic sensing element shown in FIG. 1, shield layers 10 and 66, which also serve as electrodes, are formed above and under the multilayer film from the substrate 11 to the non-magnetic layer 26. The current flowing between the aforementioned shield layers 10 and 66 is specified to be CPP (current perpendicular to the plane) type, and therefore, flows through the aforementioned multilayer film in the film thickness direction (the Z direction shown in the drawing). In the embodiment shown in FIG. 1, the gap length G1 is determined by the length dimension in the film thickness direction (the Z direction shown in the drawing) from the substrate layer 11 to the non-magnetic layer 26.

The characteristics of the magnetic sensing element according to the present invention will be described below. In the present invention, as shown in FIG. 2, the aforementioned second antiferromagnetic layers 22 are formed on both the edge sections A and the middle rear end B of the aforementioned free magnetic layer 67. That is, the aforementioned second antiferromagnetic layers 22 cover all over the free magnetic layer 67 except for the middle front end C of the aforementioned free magnetic layer 67.

In this manner, an exchange coupling magnetic field is generated between the aforementioned second antiferromagnetic layers 22 and both the edge sections A and middle rear end B of the free magnetic layer 67, the magnetization of the aforementioned both edge sections A and middle rear end B of the free magnetic layer 67 is pinned, for example, in the direction parallel to the X direction shown in the drawing, that is, in the leftward direction shown in the drawing. On the other hand, the magnetization of the middle-front end C of the aforementioned free magnetic layer 67 is aligned in the leftward direction shown in the drawing, and is weakly brought into the condition of a single domain, so that magnetic reversal can be brought about with respect to an external magnetic field.

At this time, it is assumed that sense current flows into the middle front end C of the aforementioned free magnetic layer 67 in the direction opposite to the Z direction shown in the drawing (that is, in the downward direction perpendicular to the paper surface). A sense current magnetic field generated following the corkscrew rule is directed in the direction opposite to the magnetization direction (that is, the rightward direction) of the aforementioned free magnetic layer 67 in a height-side (the Y direction shown in the drawing) region K of the middle front end C of the aforementioned free magnetic layer 67. In particular, it is known that the aforementioned sense current magnetic field is enhanced with increasing proximity to both edges C1, a height-side edge C2 and an edge C3 on the side of the surface facing the recording medium of the middle front end C of the aforementioned free magnetic layer 67.

Since the vicinity of both the edges C1 of the aforementioned free magnetic layer 67 are regions in which the bias magnetic field by the second antiferromagnetic layers 22 arranged on both the edge sections A of the aforementioned free magnetic layer 67 is strong, the magnetization of the aforementioned free magnetic layer 67 is not disturbed, and is properly directed in the leftward direction shown in the drawing. In the vicinity of the edge C3 on the side of the surface facing the recording medium of the aforementioned free magnetic layer 67, since the aforementioned sense current magnetic field is directed in the leftward direction shown in the drawing, the magnetization direction agrees with that of the free magnetic layer 67, and therefore, it is not feared that the magnetization of the free magnetic layer 67 is disturbed.

Conventionally, the magnetization was undesirably disturbed in the height-side region of the free magnetic layer 67, that is, in the vicinity of the height-side edge C2 of the aforementioned free magnetic layer 67 in FIG. 2. However, in the present invention, the second antiferromagnetic layers are provided not only on both the edge sections A of the aforementioned free magnetic layer 67, but also on the middle rear end B, and therefore, the middle rear end B of the aforementioned free magnetic layer 67 is magnetized, followed by pinning. In this manner, a strong bias magnetic field G is applied in the vicinity of the height-side edge C2 of the middle front end of the aforementioned free magnetic layer 67, and thereby, the aforementioned sense current magnetic field in the direction opposite to the magnetization direction of the aforementioned free magnetic layer 67 is cancelled by this bias magnetic field, and turbulence in the magnetization in the vicinity of the height-side edge C2 of the aforementioned free magnetic layer 67 due to the aforementioned sense current magnetic field can be properly alleviated. In addition, it is clear from the experiment described below that the hysteresis can be made smaller than ever.

In particular, as is clear from the experiment described below, even when the sense current (sense current density) is increased, an R-H curve (may be referred to as a QST curve) is hardly changed, the hysteresis can be kept small, and a magnetic sensing element having a large playback output can be properly manufactured.

The flow direction of the sense current and the magnetization direction of the free magnetic layer 67 must be adjusted in order that the aforementioned sense current magnetic field in the vicinity of the height-side edge C2 of the middle front end C of the aforementioned free magnetic layer 67 is directed in the direction opposite to the magnetization direction of the free magnetic layer 67. For example, when the sense current flows in the Z direction shown in the drawing (that is, in the upward direction perpendicular to the paper surface), the aforementioned sense current magnetic field in the vicinity of the edge C3, on the side of the surface facing the recording medium, of the middle front end C of the aforementioned free magnetic layer 67 is directed in the direction opposite to the magnetization direction of the free magnetic layer 67. Consequently, the turbulence in the magnetization in the vicinity of the aforementioned edge C3 on the side of the surface facing the recording medium cannot be suppressed by the aforementioned second antiferromagnetic layer 22 at some distance therefrom, and the hysteresis is thereby increased.

Therefore, the aforementioned sense current magnetic field in the vicinity of the height-side edge C2 of the middle front end C of the aforementioned free magnetic layer 67 must be directed in the direction opposite to the magnetization direction of the free magnetic layer 67.

The middle front end C of the free magnetic layer 67 shown in FIG. 2 is a region referred to as a track-width region. That is, this region is a region in which the middle front end C of the aforementioned free magnetic layer 67 contributes to the magnetoresistance effect, and the width dimension of the aforementioned middle front end C in the track-width direction (the X direction shown in the drawing) is defined to be a track width Tw. The aforementioned track with Tw is preferably 0.15 µm or less, and the length dimension (MR height) L1 of the middle front end C of the aforementioned free magnetic layer 67 in the height direction (the Y direction shown in the drawing) is preferably 0.15 µm or more. The width dimension T1 of the total free magnetic layer 67 in the track-width direction (the X direction shown in the drawing) is preferably 1 to 100 µm, and the length dimension L2 of the total free magnetic layer 67 in the height direction (the Y direction shown in the drawing) is preferably 0.5 to 50 µm.

When the second antiferromagnetic layer 22 is provided on the middle rear end B of the aforementioned free magnetic layer 67, an entire region on the rear end side of the aforementioned free magnetic layer 67 is magnetized, followed by pinning. However, the rear end of the aforementioned free magnetic layer 67 does not significantly contribute to the sensitivity with respect to a recording magnetic field generated from the recording medium, but the region on the side of the surface facing the recording medium primarily contributes thereto. In addition, sense current does not flow through the rear end of the free magnetic layer 67. Consequently, even when the second antiferromagnetic layer 22 is provided on the middle rear end B of the aforementioned free magnetic layer 67, the sensitivity is not sacrificed.

In the embodiment shown in FIG. 2, the second antiferromagnetic layers 22 provided on both the edge sections A and the middle rear end B of the aforementioned free magnetic layer 67 are integrally arranged. That is, the integrated second antiferromagnetic layers 22 are arranged in regions A1, A2 and B shown in FIG. 2. When the aforementioned second antiferromagnetic layers 22 are integrally arranged, the manufacturing process of the aforementioned second antiferromagnetic layers 22 can be desirably simplified. However, in the present invention, the second antiferromagnetic layers 22 arranged on both the edge sections A and the middle rear end B of the aforementioned free magnetic layer 67 may be separately provided. Furthermore, the aforementioned second antiferromagnetic layers 22 may be provided simply on the front ends A1 of both the edge sections and the middle rear end B of the free magnetic layer 67 shown in FIG. 2 (that is, the aforementioned second antiferromagnetic layer 22 is not provided in the regions A2).

In the embodiment shown in FIG. 1 to FIG. 3, the insulating layer 24 is arranged on the aforementioned second antiferromagnetic layers 22, and the upper shield layer 66 which functions as an upper electrode is arranged over the aforementioned insulating layer 24 and the non-magnetic layer 26 on the middle front end C of the aforementioned free magnetic layer 67. In this manner, since the insulating layer 24 is provided on the aforementioned second antiferromagnetic layers 22, the sense current flowing from the aforementioned upper shield layer 66 to below the free magnetic layer 67 is not diverted into the aforementioned second antiferromagnetic layers 22, and properly flows simply into the middle front end C of the multilayer film from the aforementioned substrate layer 11 to the non-magnetic layer 26. Consequently, a magnetic sensing element having a large playback output can be manufactured.

In the embodiment shown in FIGS. 1 and 2, an inner edge 24a of the aforementioned insulating layer 24 is arranged extending onto a part of the aforementioned middle front end C of the aforementioned free magnetic layer 67. That is, the aforementioned insulating layer 24 is arranged overlapping the aforementioned middle front end C. In FIG. 2, the overlap region of the aforementioned insulating layer 24 is indicated by a dotted line. The upper shield layer 66 which functions as the upper electrode is formed over the aforementioned insulating layer 24 and the middle front end C of the aforementioned free magnetic layer 67, not covered with the aforementioned insulating layer 24.

In this manner, the inner edge 24a of the aforementioned insulating layer 24 is formed overlapping the middle front end C of the aforementioned free magnetic layer 67, and thereby, inner edge surfaces 22a of the aforementioned second antiferromagnetic layers 22 are brought into a condition of being completely covered with the aforementioned insulating layer 24. Consequently, diversion of the sense current from the aforementioned upper shield layer 66 into the aforementioned second antiferromagnetic layer 22 can be more effectively suppressed, and a magnetic sensing element having a large playback output can be manufactured.

In the embodiment shown in FIG. 1, the aforementioned non-magnetic material layer 18 was formed from a non-magnetic conductive material, for example, Cu. However, the aforementioned non-magnetic material layer 18 may be formed from an insulating material, for example, $Al_2O_3$ and $SiO_2$. The former has a film configuration referred to as a spin valve type thin film element, and the latter has a film configuration referred to as a tunneling magnetoresistance effect type element.

In the tunneling magnetoresistance effect type element, when a voltage is applied to the free magnetic layer 67 and the pinned magnetic layer 64, electric current (tunneling current) flows through the non-magnetic material layer 18, and the tunnel effect is exhibited. Since the magnetization of the free magnetic layer 67 fluctuates under the influence of an external magnetic field, the fluctuating tunneling current is taken as signals, and a leakage magnetic field from the recording medium is detected.

As described above, in the embodiment shown in FIG. 1, the lower shield layer 10 and the upper shield layer 66 have functions as the lower electrode and the upper electrode, respectively. The aforementioned shield layers 10 and 66 are essentially provided in order to interrupt entrance of magnetic fields and the like, except for a target medium signal magnetic field, into the magnetic sensing element. However, when these shield layers 10 and 66 are used as not only shields, but also electrodes, it is not necessary to separately provide the electrodes. Consequently, the manufacturing process can be simplified, and in addition, the spacing between the shield layers 10 and 66, that is, the gap length G1, can be reduced. However, when the aforementioned shield layers 10 and 66 are used as the electrodes, a layer to become a lower gap layer (the substrate layer 11 in FIG. 1) must be provided above the lower shield layer 10, and a layer to become an upper gap layer (the non-magnetic layer 26 in FIG. 1) must be provided under the upper shield layer 66.

Regarding the location of arrangement of the aforementioned non-magnetic layer 26, in FIG. 1, the aforementioned non-magnetic layer 26 is provided simply on the middle front end C of the free magnetic layer 67. However, the aforementioned non-magnetic layer 26 may be provided on both the edge sections A and the middle rear end B of the aforementioned free magnetic layer 67, although the nonmagnetic layer 26 on the aforementioned both edge sections A and the middle rear end B preferably have very small film thicknesses of 3 angstroms or less. This is because when the film thickness of the aforementioned non-magnetic layer is not small, no exchange coupling magnetic field having a proper magnitude can be generated between the free magnetic layer 67 and the second antiferromagnetic layer 22.

Figure 4:
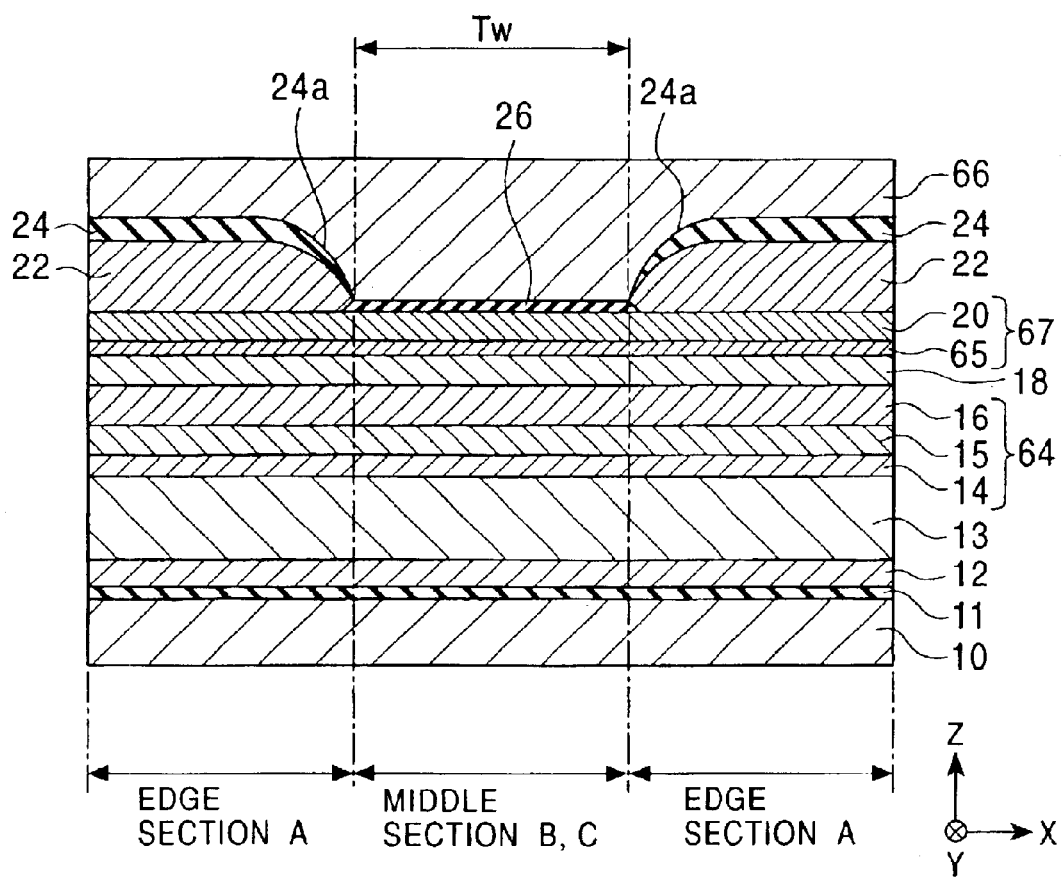
FIG. 4 is a partial sectional view of a magnetic sensing element according to a second embodiment of the present invention, viewed from the side of the surface facing a recording medium.
Figure 5:
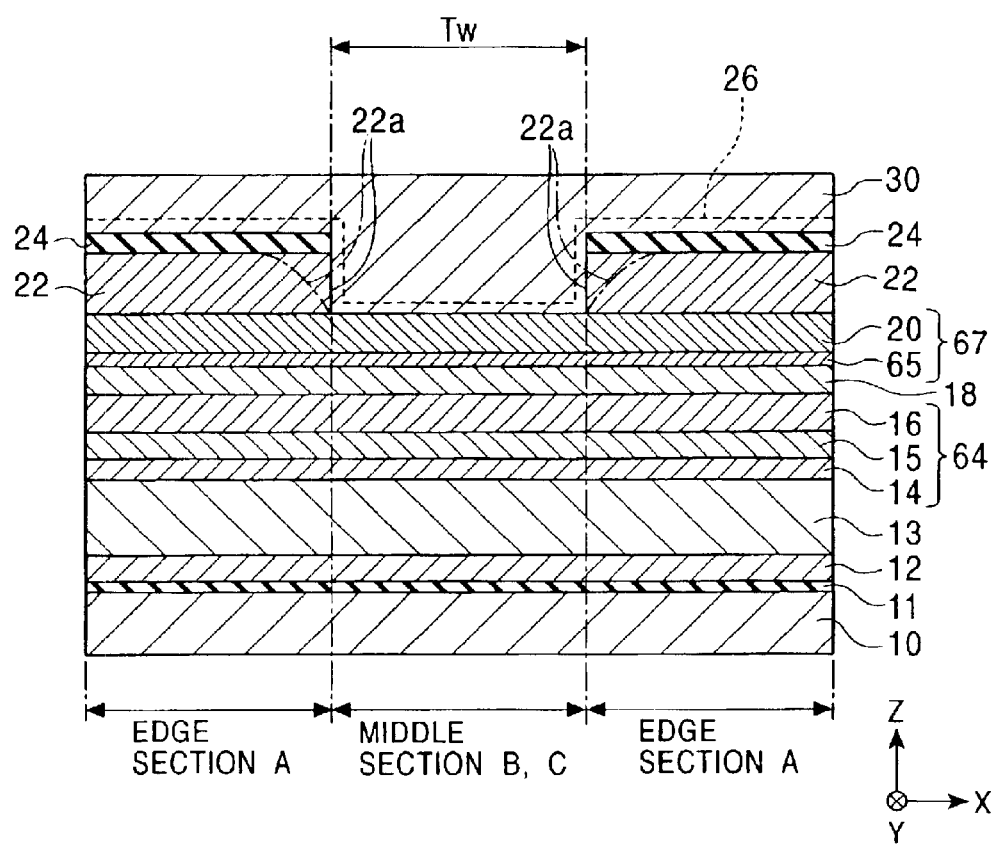
FIG. 5 is a partial sectional view of a magnetic sensing element according to a third embodiment of the present invention, viewed from the side of the surface facing a recording medium.
Figure 6:
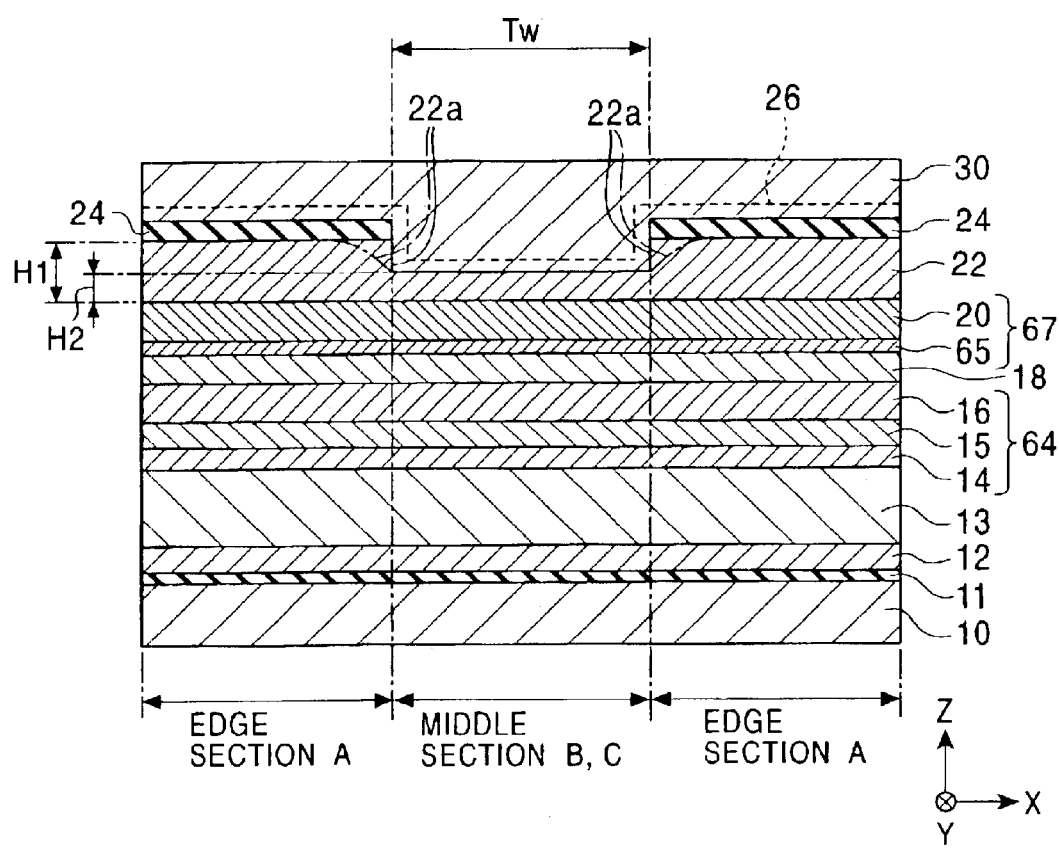
FIG. 6 is a partial sectional view of a magnetic sensing element according to a fourth embodiment of the present invention, viewed from the side of the surface facing a recording medium.

In FIG. 4 to FIG. 6, in a manner similar to that in FIG. 1, second antiferromagnetic layers 22 are provided on both edge sections and the middle rear end B of a free magnetic layer 67 (refer to FIG. 2). However, the forms of an insulating layer 24 and the second antiferromagnetic layers 22 are somewhat different from those shown in FIG. 1.

FIG. 4 is a partial sectional view of the structure of a magnetic sensing element according to the second embodiment of the present invention, viewed from the side of the surface facing a recording medium.

In the embodiment shown in FIG. 4, inner edges 24a of the insulating layer 24 arranged on the aforementioned second antiferromagnetic layer 22 are not extended onto a non-magnetic layer 26 on the middle front end C of the aforementioned free magnetic layer 67. Even in such a case, the diversion loss of sense current which is diverted from an upper shield layer 66 having a function as an upper electrode into the aforementioned second antiferromagnetic layer 22 can be reduced, and therefore, a magnetic sensing element having a large playback output can be manufactured.

In the embodiment shown in FIG. 4 as well, in a manner similar to that in FIG. 1, the second antiferromagnetic layers 22 are arranged on both the edge sections A and the middle rear end B of the free magnetic layer 67 (refer to FIG. 2), and the middle rear end B of the aforementioned free magnetic layer 67 is magnetized, followed by pinning. In this manner, a strong bias magnetic field is applied in the vicinity of a height-side edge C2 of the middle front end C of the aforementioned free magnetic layer 67, and thereby, a sense current magnetic field in the direction opposite to the magnetization direction of the free magnetic layer 67 is cancelled by the aforementioned bias magnetic field. Consequently, turbulence in the magnetization in the vicinity of the height-side edge C2 can be alleviated, and a magnetic sensing element having a small hysteresis can be manufactured.

FIG. 5 is a partial sectional view of the structure of a magnetic sensing element according to the third embodiment of the present invention, viewed from the side of the surface facing a recording medium.

The magnetic sensing element in the present embodiment is formed by a manufacturing method different from that for the magnetic sensing elements shown in FIGS. 1 and 4. The manufacturing method therefor will be described below.

In the magnetic sensing element of the embodiment shown in FIG. 5 as well, second antiferromagnetic layers 22 are arranged on both edge sections A and the middle rear end B of a free magnetic layer 67 (refer to FIG. 2), the middle rear end B of the aforementioned free magnetic layer 67 is magnetized, followed by pinning. In this manner, a strong bias magnetic field is applied in the vicinity of a height-side edge C2 of the middle front end C of the aforementioned free magnetic layer 67, and thereby, a sense current magnetic field in the direction opposite to the magnetization direction of the free magnetic layer 67 is cancelled by the aforementioned bias magnetic field. Consequently, turbulence in the magnetization in the vicinity of the height-side edge C2 can be alleviated, and a magnetic sensing element having small hysteresis can be manufactured.

In the embodiment shown in FIG. 5, inner edge surfaces 22a of the aforementioned second antiferromagnetic layer 22 are arranged extending in the vertical direction (the Z direction shown in the drawing) from the top surface of the free magnetic layer 67, and an insulating layer 24 is arranged on the top surface of the aforementioned second antiferromagnetic layer 22. However, the inner edge surfaces 22a of the aforementioned second antiferromagnetic layer 22 may be formed into inclined surfaces or curved surfaces, as indicated by alternate long and short dashed lines, and therefore, the aforementioned inner edge surfaces 22a may be formed in order that the distance from the middle front end C is gradually increased as the location on the inner edge surface 22a is changed from the bottom surface toward the top surface (in the Z direction shown in the drawing).

In the embodiment shown in FIG. 5, the non-magnetic layer 26 is not arranged between the aforementioned free magnetic layer 67 and an upper electrode 30. However, the aforementioned non-magnetic layer 26 may be arranged all over the middle front end of the aforementioned free magnetic layer 67 and the insulating layer 24, as indicated by a dotted line. The presence or absence of the aforementioned non-magnetic layer 26 is depending on a manufacturing method described below. When the aforementioned non-magnetic layer 26 is provided on the aforementioned free magnetic layer 67, this non-magnetic layer 26 is allowed to function as an upper gap layer, and in a manner similar to that in FIGS. 1 and 4, it is possible that the aforementioned upper electrode 30 is formed from a magnetic material, and is allowed to also serve as an upper shield layer. When the non-magnetic layer 26 is not provided, and no layer to become the upper gap layer is present between the aforementioned free magnetic layer 67 and the upper electrode 30, the upper gap layer and the upper shield layer must be provided on the aforementioned free magnetic layer 67.

FIG. 6 is a partial sectional view of a magnetic sensing element according to the fourth embodiment of the present invention, viewed from the side of the surface facing a recording medium.

In the embodiment shown in FIG. 6 as well, in a manner similar to that in the embodiments shown in FIGS. 1, 4 and 5, the second antiferromagnetic layers 22 are arranged on both the edge sections A and the middle rear end B of the free magnetic layer 67 (refer to FIG. 2). However, in the present embodiment, the aforementioned second antiferromagnetic layer 22 is also arranged on the middle front end C of the aforementioned free magnetic layer 67.

As shown in FIG. 6, the film thickness of the aforementioned second antiferromagnetic layer 22 arranged on the middle front end C of the aforementioned free magnetic layer 67 is H2, the film thicknesses of the aforementioned second antiferromagnetic layers 22 arranged on both the edge sections A and the middle rear end B of the aforementioned free magnetic layer 67 are H1, and H1 is larger than H2.

Preferably, the second antiferromagnetic layers 22 arranged on the aforementioned both edge sections A and the middle rear end B are formed to have the film thickness H1 of 80 angstroms or more, but 300 angstroms or less. When formed to have such a degree of large film thickness, an exchange coupling magnetic field is properly generated between the aforementioned second antiferromagnetic layer 22 and the free magnetic layer 67, and therefore, both the edge sections A and the middle rear end B of the aforementioned free magnetic layer 67 are magnetized, followed by pinning.

On the other hand, the second antiferromagnetic layer 22 arranged on the middle front end C of the aforementioned free magnetic layer 67 is formed to have the film thickness H2 of, preferably, 50 angstroms or less (except for 0 angstrom), and more preferably, 40 angstroms or less. When the aforementioned second antiferromagnetic layer 22 is formed to have such a degree of small film thickness, no exchange coupling magnetic field is generated between the middle front end C of the aforementioned free magnetic layer 67 and the second antiferromagnetic layer 22, or even if generated, the value thereof is small. Therefore, the middle front end C of the aforementioned free magnetic layer 67 can be prevented from being magnetized, followed by pinning, due to the aforementioned exchange coupling magnetic field.

In this manner, the provision of the aforementioned second antiferromagnetic layer 22 brings about the magnetization, followed by pinning, of both the edge sections A and the middle rear end B of the free magnetic layer 67 (refer to FIG. 2). When the middle rear end B of the aforementioned free magnetic layer 67 is magnetized, followed by pinning, a strong bias magnetic field is thereby applied in the vicinity of a height-side edge C2 of the middle front end C of the aforementioned free magnetic layer 67, and a sense current magnetic field in the direction opposite to the magnetization direction of the free magnetic layer 67 is cancelled by the aforementioned bias magnetic field. Consequently, turbulence in the magnetization in the vicinity of the height-side edge C2 can be alleviated, and a magnetic sensing element having small hysteresis can be manufactured.

In the embodiment shown in FIG. 6, in a manner similar to that in FIG. 5, inner edge surfaces 22a of the aforementioned second antiferromagnetic layer 22 are arranged extending in the vertical direction (the Z direction shown in the drawing) from the top surface of the aforementioned free magnetic layer 67. However, the inner edge surfaces 22a of the aforementioned second antiferromagnetic layer 22 may be formed into inclined surfaces or curved surfaces, as indicated by alternate long and short dashed lines, and therefore, the aforementioned inner edge surfaces 22a may be formed in order that the distance from the middle front end C is gradually increased as the location on the inner edge surface 22a is changed from the bottom surface toward the top surface (in the Z direction shown in the drawing).

In the embodiment shown in FIG. 6, the non-magnetic layer 26 is not arranged between the aforementioned free magnetic layer 67 and an upper electrode 30. However, since the second antiferromagnetic layer 22 remaining on the middle front end C and having the film thickness of H2 exhibits no antiferromagnetism, and functions as a non-magnetic layer, the middle front end C of the aforementioned second antiferromagnetic layer 22 is allowed to function as an upper gap layer. In addition, the aforementioned non-magnetic layer 26 may be arranged all over the middle front end C of the second antiferromagnetic layer 22 having the aforementioned film thickness of H2 and an insulating layer 24, as indicated by a dotted line. When the aforementioned non-magnetic layer 26 is provided on the middle front end C of the aforementioned second antiferromagnetic layer 22, a layer composed of combination of this non-magnetic layer 26 and the second antiferromagnetic layer 22 having a film thickness of H2 is allowed to function as the upper gap layer, and in a manner similar to that in FIGS. 1 and 4, it is possible that the aforementioned upper electrode 30 is formed from a magnetic material, and is allowed to also serve as the upper shield layer.

As described above, in the embodiments shown in FIGS. 1 to 6, the method for controlling the magnetization of the free magnetic layer 67 uses the second antiferromagnetic layer 22. In the embodiments shown in FIGS. 7 to 9, the method for controlling the magnetization of the aforementioned free magnetic layer 67 uses a hard bias layer.

Figure 7:
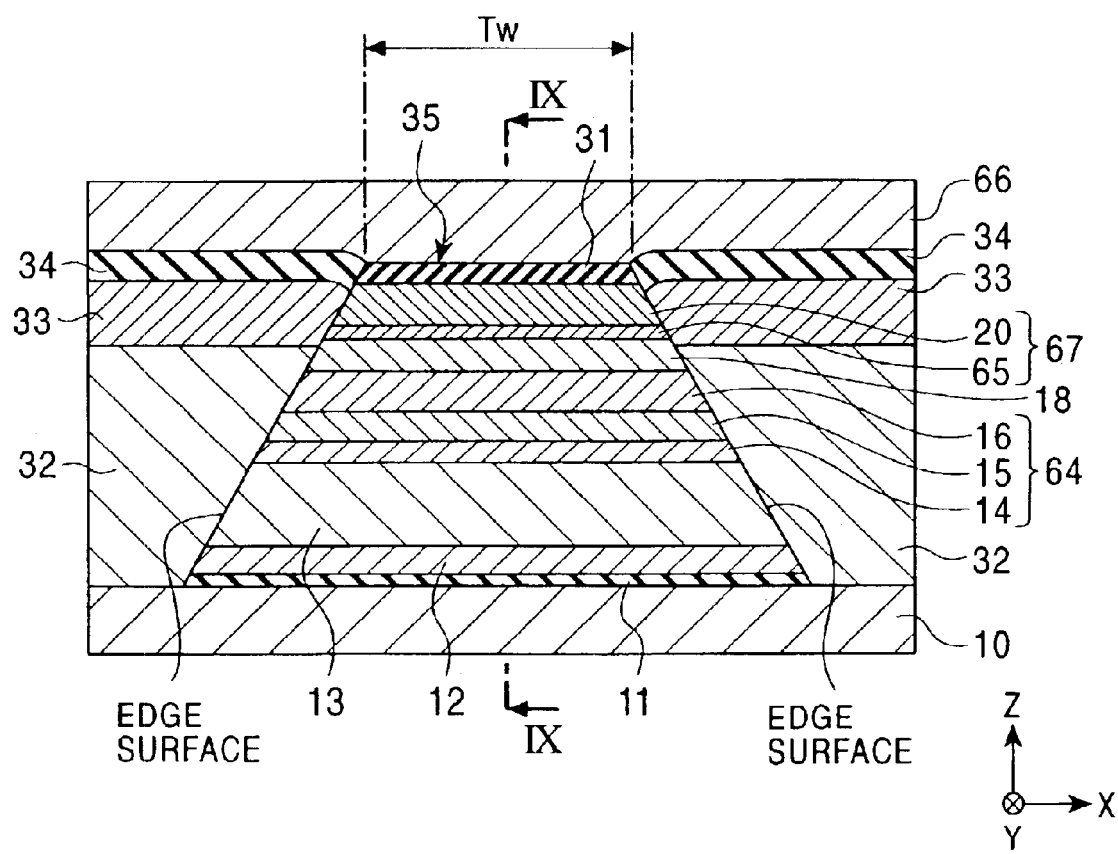
FIG. 7 is a partial sectional view of a magnetic sensing element according to a fifth embodiment of the present invention, viewed from the side of the surface facing a recording medium.
Figure 8:
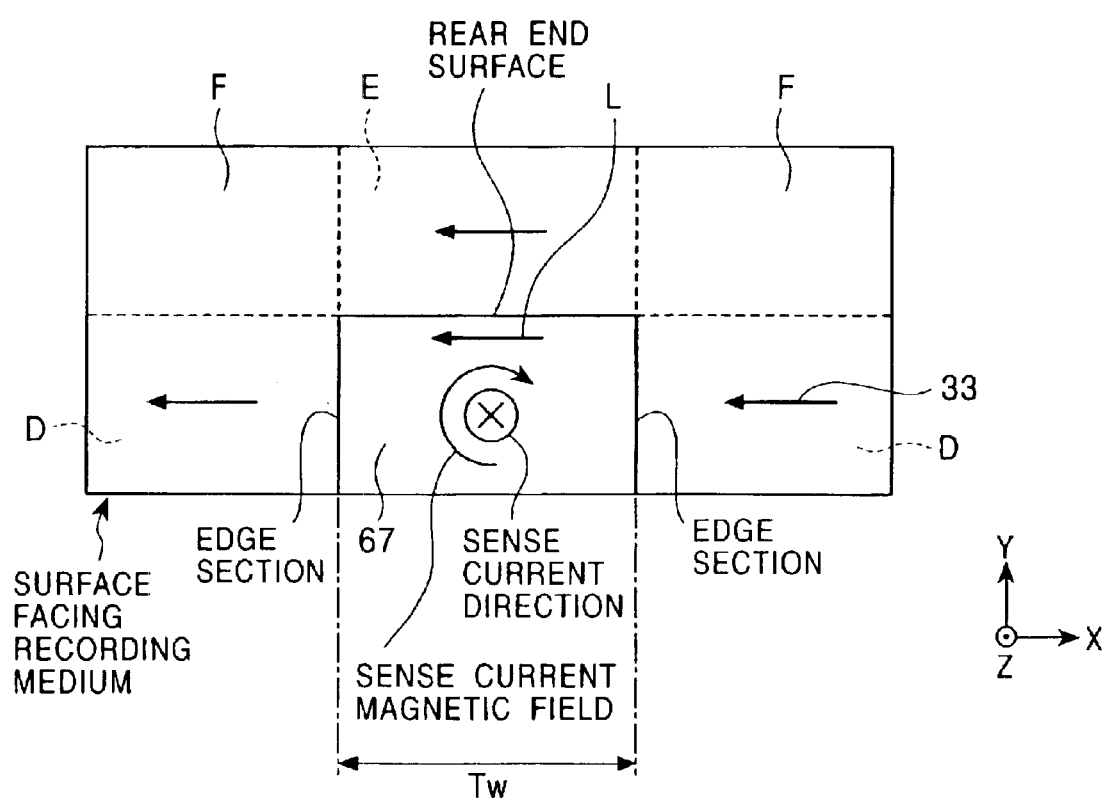
FIG. 8 is a partial plan view of the free magnetic layer and the hard bias layers of the magnetic sensing element shown in FIG. 7, viewed from directly above.
Figure 9:
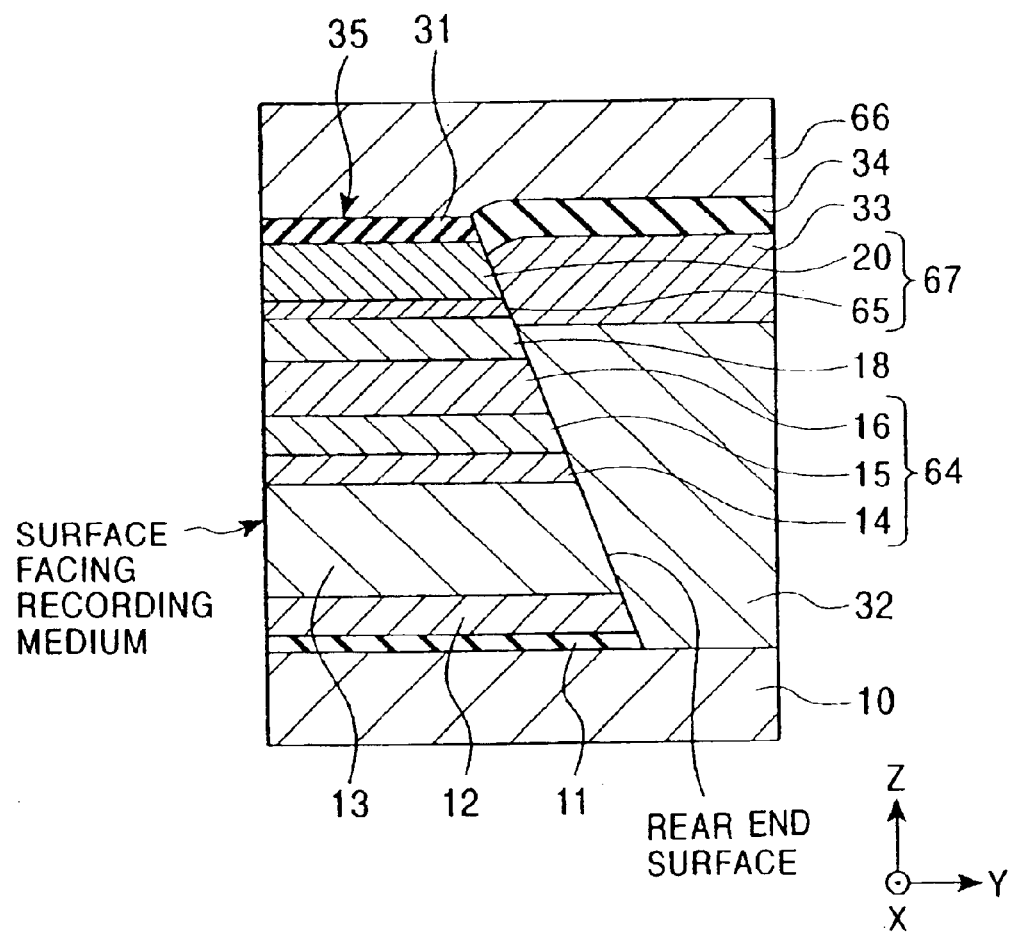
FIG. 9 is a partial vertical sectional view of the magnetic sensing element cut from the line IX—IX to the height direction shown in FIG. 7, viewed from the direction indicated by arrows.
Figure 10:
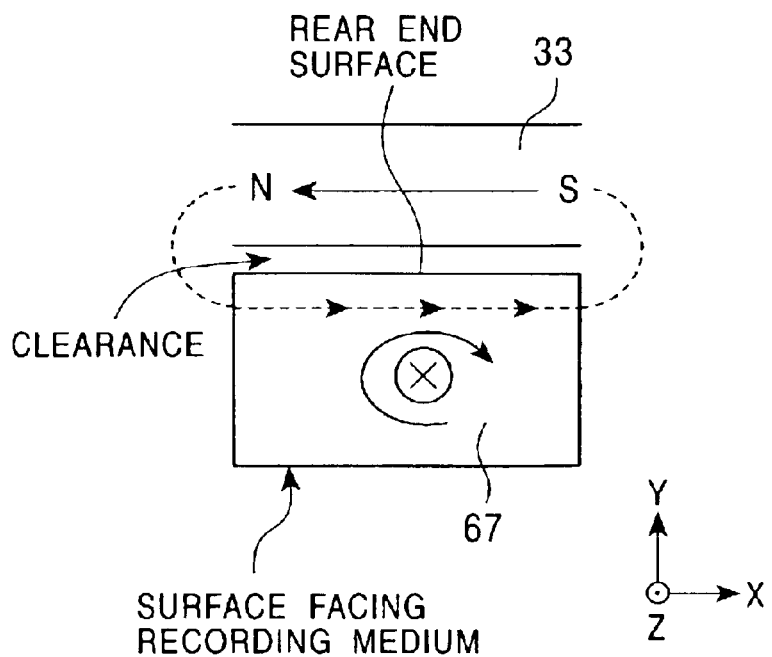
FIG. 10 is a partial plan view of a free magnetic layer and hard bias layers, showing an undesirable form.

FIG. 7 is a partial sectional view of the structure of a magnetic sensing element according to the fifth embodiment of the present invention, viewed from the side of the surface facing a recording medium. FIG. 8 is a partial plan view simply showing the part of the free magnetic layer and the hard bias layers of the magnetic sensing element shown in FIG. 7. FIG. 9 is a partial vertical sectional view of the magnetic sensing element cut from the line IX—IX to the height direction shown in FIG. 7, viewed from the direction indicated by arrows.

In the embodiment shown in FIGS. 7 and 9, a substrate layer 11 which also serves as a lower gap layer, a seed layer 12, a first antiferromagnetic layer 13, a pinned magnetic layer 64 having a laminated ferrimagnetic structure, a non-magnetic material layer 18 and a free magnetic layer 67 are arranged on the lower shield layer 10 made of a magnetic material, which also serves as a lower electrode, in that order from the bottom at the element center. The material, film thickness and the like of each layer are the same as those in FIG. 1, and therefore, FIG. 1 may be referred to.

A protective layer 31 made of a non-magnetic material is arranged on the aforementioned free magnetic layer shown in FIGS. 7 and 9. In the present embodiment, the aforementioned protective layer 31 also functions as an upper gap layer. Preferably, the aforementioned protective layer 31 is formed from at least one selected from the group consisting of Ta, Hf, Nb, Zr, Ti, Mo and W.

As shown in FIG. 7, both edge surfaces of a multilayer film from the substrate layer 11 to the protective layer 31 in the track-width direction (the X direction shown in the drawing) is formed to be inclined surfaces or curved surfaces. The width dimension of the aforementioned multilayer film in the track-width direction (the X direction shown in the drawing) is gradually decreased as the protective film 31 is approached from the substrate layer 11. A track width Tw is defined as the width dimension of the top surface of the aforementioned free magnetic layer 67 in the track-width direction.

Insulating layers 32 formed from an insulating material, for example, $Al_2O_3$ and $SiO_2$, are arranged on the aforementioned lower shield layer 10 on both sides of the aforementioned multilayer film in the track-width direction (the X direction shown in the drawing).

As shown in FIG. 9, the aforementioned insulating layer 32 is also arranged on the rear end surface side of the aforementioned multilayer film. Here, a "rear end surface" refers to the reverse of a "surface facing a recording medium". The aforementioned insulating layers 32 are arranged over both the edge surfaces and the rear end surface of the aforementioned multilayer film as an integrated layer.

As shown in FIG. 7, FIG. 8 and FIG. 9, hard bias layers 33 are arranged on the aforementioned insulating layers 32. The aforementioned hard bias layer is formed from a permanent magnet, for example, a CoPtCr alloy and a CoPt alloy.

Since the aforementioned hard bias layers 33 are arranged on the aforementioned insulating layers 32, the aforementioned hard bias layers 33 are thereby provided not only on both the edge surfaces of the aforementioned multilayer film 35, but also on the rear end surface of the aforementioned multilayer film 35, as shown in FIGS. 7 to 9.

Since the aforementioned hard bias layers 33 are provided to align the magnetization of the free magnetic layer 67 in the direction parallel to the X direction shown in the drawing, the aforementioned hard bias layers 33 must be arranged facing at least a part of both the edge surfaces of the aforementioned free magnetic layer 67. In the present embodiment, the top surface of the aforementioned insulating layer 32 is arranged under the bottom surface of the aforementioned free magnetic layer 67, and therefore, the aforementioned hard bias layers 33 are in the condition of facing the whole of both edge surfaces of the aforementioned free magnetic layer 67. The vertical bias magnetic fields of the aforementioned hard bias layers 33 flow into both the edge surfaces of the aforementioned free magnetic layer 67, and thereby, the magnetization of the aforementioned free magnetic layer 67 is aligned in the direction opposite to the X direction shown in the drawing.

As shown in FIG. 7, insulating layers 34 formed from an insulating material, for example, $Al_2O_3$ and $SiO_2$, are arranged on the aforementioned hard bias layers 33. An upper shield layer 66 is arranged over the aforementioned insulating layers 34 and the aforementioned protective layer 31. The aforementioned upper shield layer 66 functions as an upper electrode in the present embodiment.

The characteristics of the magnetic sensing element shown in FIGS. 7 to 9 will be described below. In the magnetic sensing element shown in FIGS. 7 to 9, the hard bias layers 33 are provided facing not only both the edge surfaces of the aforementioned free magnetic layer 67, but also the rear end surface of the aforementioned free magnetic layer 67. Bias substrate layers formed from Cr or the like may be provided between the aforementioned hard bias layers 33 and both the edge surfaces of the aforementioned free magnetic layer 67 in order to improve the characteristics (coercive force Hc and squareness ratio) of the aforementioned hard bias layers 33. However, this bias substrate layer is not provided between the aforementioned hard bias layer 33 and the rear end surface of the aforementioned free magnetic layer 67, and the hard bias layer 33 provided on the aforementioned rear end surface side is arranged in contact with the rear end surface of the aforementioned free magnetic layer 67. When the aforementioned hard bias layer 33 is arranged in contact with the rear end surface of the aforementioned free magnetic layer 67, an exchange interaction is brought about, and therefore, the vicinity of the rear end surface of the aforementioned free magnetic layer 67 is strongly magnetized in the magnetization direction of the aforementioned hard bias layer 33.

In FIG. 8, the aforementioned hard bias layers 33 are magnetized in the direction parallel to the track-width direction (the X direction shown in the drawing), that is, in the leftward direction shown in the drawing. Consequently, the magnetization of the aforementioned free magnetic layer 67 is aligned in the leftward direction shown in the drawing by the vertical magnetic fields from the aforementioned hard bias layers 33.

When it is assumed that sense current flows into the aforementioned free magnetic layer 67 in the direction opposite to the Z direction shown in the drawing (that is, in the downward direction perpendicular to the paper surface), as shown in FIG. 8, a sense current magnetic field generated following the corkscrew rule is directed in the direction opposite to the magnetization direction of the aforementioned free magnetic layer 67 (the rightward direction in the drawing) on the rear end surface side of the aforementioned free magnetic layer 67. In particular, the aforementioned sense current magnetic field is enhanced in the vicinity of the rear end surface of the aforementioned free magnetic layer 67.

However, in the present invention, as described above, the hard bias layer 33 is arranged in contact with the rear end surface of the aforementioned free magnetic layer 67, the magnetization L in the vicinity of the rear end surface of the aforementioned free magnetic layer 67 is strongly magnetized in the leftward direction shown in the drawing by the exchange interaction with the aforementioned hard bias layer 33, and thereby, the sense current magnetic field in the direction opposite thereto is cancelled, and influence of the aforementioned sense current magnetic field can be weakened. Consequently, a magnetic sensing element having hysteresis smaller than ever can be manufactured.

Here, no bias substrate layer made of Cr or the like is interposed between the rear end surface of the aforementioned free magnetic layer 67 and the hard bias layer 33, and the rear end surface of the aforementioned free magnetic layer 67 and the hard bias layer 33 must be arranged in contact with each other (magnetically connected). The reason for this is that if any bias substrate layer made of Cr or the like is interposed, the vertical bias magnetic field generated from the aforementioned hard bias layer 33 is limited to be simply a static magnetic field.

Therefore, when there is a clearance between the rear end surface of the aforementioned free magnetic layer 67 and the hard bias layer 33, a static magnetic field in the rightward direction shown in the drawing flows into the aforementioned free magnetic layer 67 from the hard bias layer 33 magnetized in the leftward direction shown in the drawing. Consequently, the magnetization direction in the vicinity of the rear end surface of the aforementioned free magnetic layer 67 further becomes likely to be directed in the rightward direction shown in the drawing, and as a result, the magnetization direction of the aforementioned free magnetic layer 67 is further disturbed. On the other hand, for example, when the flow direction of the sense current is made to be the Z direction shown in the drawing (the upward direction perpendicular to the paper surface), the sense current magnetic field and the aforementioned static magnetic field are allowed to become opposite in direction on the rear end surface side of the free magnetic layer 67. However, the magnetization direction (the leftward direction shown in the drawing) of the free magnetic layer 67 and the direction of the sense current magnetic field (the rightward direction shown in the drawing) thereby become opposite to each other, and as a result, turbulence in the magnetization of the free magnetic layer 67 cannot be alleviated.

Consequently, as described in the present invention, the hard bias layer 33 provided on the rear end surface of the aforementioned free magnetic layer 67 must be arranged in contact with the rear end surface of the aforementioned free magnetic layer 67.

In the present invention, preferably, the hard bias layers 33 arranged over both the edge surfaces and rear end surface of the free magnetic layer 67 are formed as an integrated layer, as shown in FIG. 8. That is, the aforementioned hard bias layers 33 are arranged in all regions D, E and F shown in FIG. 8. In this manner, the aforementioned hard bias layers 33 can be arranged with ease.

However, the hard bias layers 33 provided on both the edge surfaces of the aforementioned free magnetic layer 67 and the rear end surface of the aforementioned free magnetic layer 67 may be separately provided. For example, as shown in FIG. 8, even when the hard bias layers 33 are provided in the regions D of both the edge surfaces of the free magnetic layer 67 and the region E of the rear end surface of the aforementioned free magnetic layer 67, and the aforementioned hard bias layer 33 is not provided in the region F connecting the aforementioned regions D and the region E, the effect of the present invention can be exhibited.

As shown in FIGS. 7 and 9, preferably, an insulating layer 34 is provided on the aforementioned hard bias layers 33. In this manner, the sense current flowing from the upper shield layer 66, which functions as the aforementioned upper electrode, to the aforementioned free magnetic layer 67 can be prevented from being diverted into the aforementioned hard bias layers 33, and a magnetic sensing element having a large playback output can be manufactured.

As shown in FIGS. 7 and 9, when insulating layers 32 are provided under the aforementioned hard bias layers 33, the diversion loss of the sense current into the hard bias layers 33 can be desirably reduced.

In the magnetic sensing element shown in FIG. 7 to FIG. 9, the free magnetic layer 67, the non-magnetic material layer 18, the pinned magnetic layer 64 and the first antiferromagnetic layer 13 may be laminated in that order from the bottom.

In the present invention shown in FIG. 1 to FIG. 9, the magnetic sensing elements are limited to the CPP (current perpendicular to the plane) type magnetic sensing element in which the electric current flows through this element in the film thickness direction. When the configuration of the present invention is applied to the CIP (current in the plane) type magnetic sensing element in which the electric current flows in the direction parallel to the film surface direction of the element, the playback output is significantly reduced. Consequently, it is not preferable to apply the configuration of the present invention to the aforementioned CIP type magnetic sensing element.

When the CIP type magnetic sensing element is provided with the second antiferromagnetic layer 22 on the middle rear end B of the free magnetic layer 67, or is provided with the hard bias layer 33 on the rear end surface side of the aforementioned free magnetic layer 67 in a manner similar to that in the present invention, the sense current is diverted into the second antiferromagnetic layer 22 on the middle rear end B or the hard bias layer 33 on the rear end surface side of the aforementioned free magnetic layer 67, and therefore, the playback output is reduced. Consequently, the configuration of the present invention is effective with respect to the CPP type magnetic sensing element.

The form of the free magnetic layer 67 in the present invention will be described below.

In the magnetic sensing elements shown in FIG. 1 to FIG. 9, every free magnetic layer 67 has a two-layer structure, and the layer on the side in contact with the non-magnetic material layer 18 is a diffusion prevention layer 65 made of CoFe, Co or the like. The magnetic material layer 20 is formed from a magnetic material, for example, a NiFe alloy.

The aforementioned free magnetic layer 67 may be formed from a single layer of a magnetic material. Examples of selectable magnetic materials include, for example, a NiFe alloy, a CoFe alloy, a CoFeNi alloy, Co and a CoNi alloy. In particular, the aforementioned free magnetic layer 67 is preferably formed from the CoFeNi alloy among them.

Figure 11:
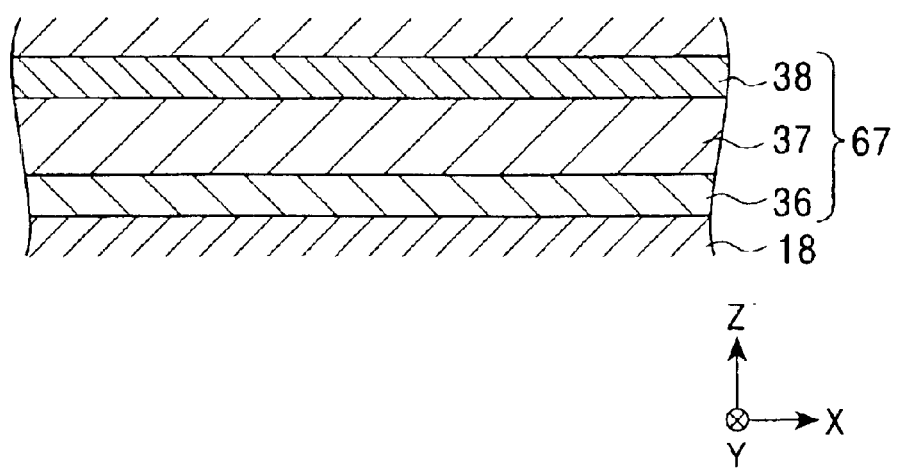
FIG. 11 is a partial sectional view of a form of a free magnetic layer of the present invention under magnification, viewed from the side of the surface facing a recording medium.

FIG. 11 is a partial sectional view primarily illustrating the portion of the aforementioned free magnetic layer 67 under magnification. The cross section is viewed from the side of the surface facing a recording medium.

In the form shown in FIG. 11, the free magnetic layer 67 has a three-layer structure. Each of the layers denoted by reference numerals 36, 37 and 38 constituting the aforementioned free magnetic layer 67 is a layer of a magnetic material. The magnetic material layer 36 is a diffusion prevention layer for preventing diffusion of elements with respect to the non-magnetic material layer 18. The aforementioned magnetic material layer 36 is formed from CoFe, Co or the like.

The magnetic material layer 38 is arranged in contact with the second antiferromagnetic layer 22. Preferably, the aforementioned magnetic material layer 38 is formed from a CoFe alloy, and thereby, an exchange coupling magnetic field generated between the aforementioned magnetic material layer 38 and the aforementioned second antiferromagnetic layer 22 can be increased.

Examples of possible combinations of materials for the three-layer structure shown in FIG. 11 include, for example, the magnetic material layer 36: CoFe/the magnetic material layer 37: NiFe/the magnetic material layer 38: CoFe.

Preferably, the free magnetic layer 67 formed simply from magnetic materials is arranged to have a film thickness in the order of 30 angstroms or more, but 40 angstroms or less. The compositional ratio of the CoFe alloy used for the free magnetic layer 67 is, for example, 90 at % of Co and 10 at % of Fe.

Figure 12:
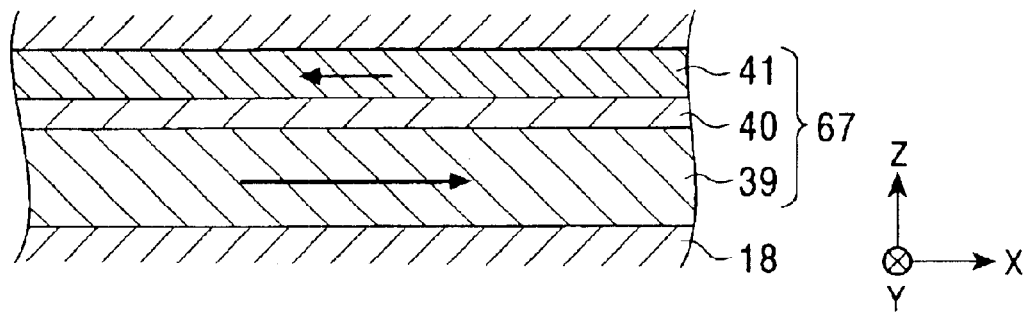
FIG. 12 is a partial sectional view of another form of a free magnetic layer of the present invention under magnification, viewed from the side of the surface facing a recording medium.

FIG. 12 is a partial sectional view showing another embodiment of the aforementioned free magnetic layer 67 under magnification. The free magnetic layer 67 shown in FIG. 12 has a structure referred to as a laminated ferrimagnetic structure. In this manner, the film thickness of a magnetically effective free magnetic layer can be reduced without significant reduction of the physical thickness of the aforementioned free magnetic layer 67, and thereby, the sensitivity with respect to an external magnetic field can be increased.

Layers denoted by reference numerals 39 and 41 are magnetic layers, and a layer denoted by a reference numeral 40 is a non-magnetic intermediate layer. The magnetic layer 39 and the magnetic layer 41 are formed from a magnetic material, for example, a NiFe alloy, a CoFe alloy, a CoFeNi alloy, Co and a CoNi alloy. In particular, the aforementioned magnetic layer 39 and/or magnetic layer 41 is preferably formed from a CoFeNi alloy among them. As the compositional ratio, preferably, Fe is 9 at % or more, but 17 at % or less, Ni is 0.5 at % or more, but 10 at % or less, and the remainder is Co.

In this manner, a coupling magnetic field due to an RKKY interaction, which takes place between the aforementioned magnetic layers 39 and 41, can be increased. Specifically, a spin flop magnetic field (Hsf) is allowed to become about 293 kA/m or more. As a result, the magnetization of the magnetic layer 39 and the magnetization of the magnetic layer 41 can be properly brought into antiparallel condition. When the composition is within the aforementioned range, the magnetostriction of the free magnetic layer 67 is allowed to fall within the range of $-3 \times 10^{-6}$ to $3 \times 10^{-6}$, and the coercive force can be reduced to 790 A/m or less.

Furthermore, an improvement of the soft magnetic characteristic of the aforementioned free magnetic layer 67 and suppression of reduction of the amount of change in resistance ($\Delta R$) and the rate of change in resistance ($\Delta R/R$) due to diffusion of Ni with respect to the non-magnetic material layer 18 can be properly achieved.

Preferably, the aforementioned non-magnetic intermediate layer 40 is formed from at least one selected from the group consisting of Ru, Rh, Ir, Cr, Re and Cu.

For example, the aforementioned magnetic layer 39 is formed to have a film thickness in the order of 35 angstroms, the non-magnetic intermediate layer 40 is formed to have a film thickness in the order of 9 angstroms, and the aforementioned magnetic layer 41 is formed to have a film thickness in the order of 15 angstroms.

When the aforementioned free magnetic layer 67 is formed to have a laminated ferrimagnetic structure, in the configuration, up to the aforementioned magnetic layer 41 may be completely removed in the middle front end C of the aforementioned free magnetic layer 67, and thereby, the non-magnetic intermediate layer 40 may be exposed at the aforementioned middle front end C. In this manner, the aforementioned free magnetic layer 67 in the middle front end C does not function as the laminated ferrimagnetic structure, but functions as a free magnetic layer formed simply from usual magnetic layers. On the other hand, the free magnetic layer 67 in both the edge sections A and the middle rear end B is brought into the laminated ferrimagnetic structure, and a unidirectional bias magnetic field is enhanced. Consequently, the free magnetic layer 67 in both the edge sections A and the middle rear end B is reliably pinned in the track-width direction, and occurrence of side leading can be prevented.

A diffusion prevention layer formed from a CoFe alloy or Co may be provided between the aforementioned magnetic layer 39 and the non-magnetic material layer 18. In addition, a magnetic layer formed from a CoFe alloy may be arranged on the aforementioned magnetic layer 41.

In this case, when the magnetic layer 39 and/or the magnetic layer 41 is formed from a CoFeNi alloy, preferably, the compositional ratio of Fe in the aforementioned CoFeNi alloy is 7 at % or more, but 15 at % or less, the compositional ratio of Ni is 5 at % or more, but 15 at % or less, and the remainder is the compositional ratio of Co.

In this manner, the coupling magnetic field due to the RKKY interaction, which takes place between the aforementioned magnetic layers 39 and 41, can be enhanced. Specifically, the spin flop magnetic field (Hsf) can be increased up to about 293 kA/m. As a result, the magnetization of the magnetic layer 39 and the magnetization of the magnetic layer 41 can be properly brought into antiparallel condition.

When the composition is within the aforementioned range, the magnetostriction of the free magnetic layer 67 is allowed to fall within the range of $-3\times10^{-6}$ to $3\times10^{-6}$, and the coercive force can be reduced to 790 A/m or less. Furthermore, an improvement of the soft magnetic characteristic of the aforementioned free magnetic layer 67 can be achieved.

Figure 13:
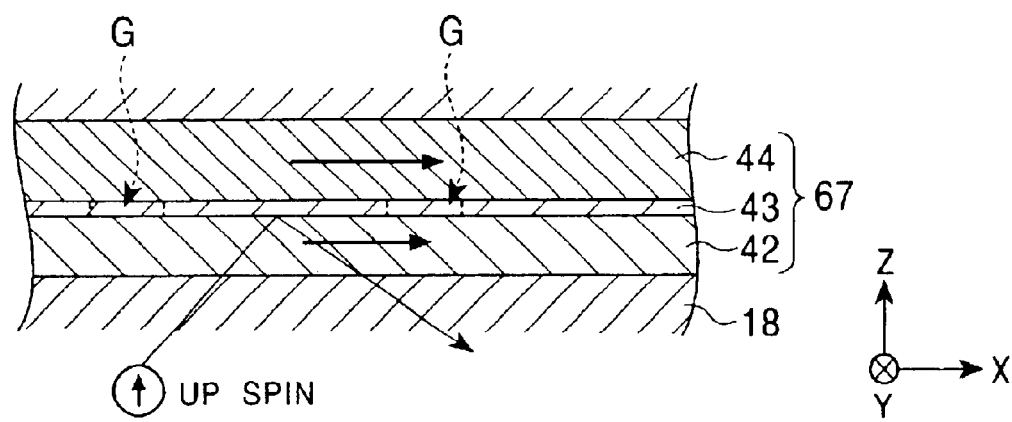
FIG. 13 is a partial sectional view of another form of a free magnetic layer of the present invention under magnification, viewed from the side of the surface facing a recording medium.

FIG. 13 is a partial sectional view showing another form of the free magnetic layer 67 of the present invention under magnification. In the free magnetic layer 67 shown in FIG. 13, a specular film 43 is arranged between magnetic material layers 42 and 44. The aforementioned specular film 43 may include a defect (pinhole) G, as shown in FIG. 13. In the embodiment shown in FIG. 13, the magnetic material layer 42 and the magnetic material layer 44 with the specular film (specular reflection layer) 43 therebetween are magnetized in the same direction (the direction indicated by arrows).

Examples of magnetic materials used for the magnetic material layers 42 and 44 include, for example, a NiFe alloy, a CoFe alloy, a CoFeNi alloy, Co and a CoNi alloy.

When the specular film 43 is arranged in the free magnetic layer 67, as shown in FIG. 13, a conductive electron (for example, a conductive electron having an up spin) reaches the aforementioned specular film 43, and is subjected to specular reflection while keeping the spinning conditions (energy, a quantum state and the like). The conductive electron having the aforementioned up spin after specular reflection changes the movement direction thereof and can pass through the free magnetic layer.

Consequently, in the present invention, when the specular film 43 is provided, a mean free path λ+ of the aforementioned conductive electron having the up spin can be made larger than ever, and thereby, a difference between the mean free path λ+ of the aforementioned conductive electron having the up spin and a mean free path λ− of a conductive electron having a down spin can be increased. Therefore, an improvement in the rate of change of resistance (ΔR/R) and an improvement in the playback output can be achieved.

In the formation of the aforementioned specular film 43, for example, film formation of up to the magnetic material layer 42 is performed, and the surface of the aforementioned magnetic material layer 42 is oxidized. This oxidized layer is allowed to function as the specular film 43. Subsequently, the magnetic material layer 44 is formed on the aforementioned specular film 43.

Examples of materials for the aforementioned specular film 43 include, for example, oxides, e.g. Fe—O, Ni—O, Co—O, Co—Fe—O, Co—Fe—Ni—O, Al—O, Al-Q-O (where Q represents at least one selected from the group consisting of B, Si, N, Ti, V, Cr, Mn, Fe, Co and Ni) and R—O (where R represents at least one selected from the group consisting of Cu, Ti, V, Cr, Zr, Nb, Mo, Hf, Ta and W), nitrides, e.g. Al—N, Al-Q-N (where Q represents at least one selected from the group consisting of B, Si, O, Ti, V, Cr, Mn, Fe, Co and Ni) and R—N (where R represents at least one selected from the group consisting of Ti, V, Cr, Zr, Nb, Mo, Hf, Ta and W) and a metalloid Heusler alloy.

Figure 14:
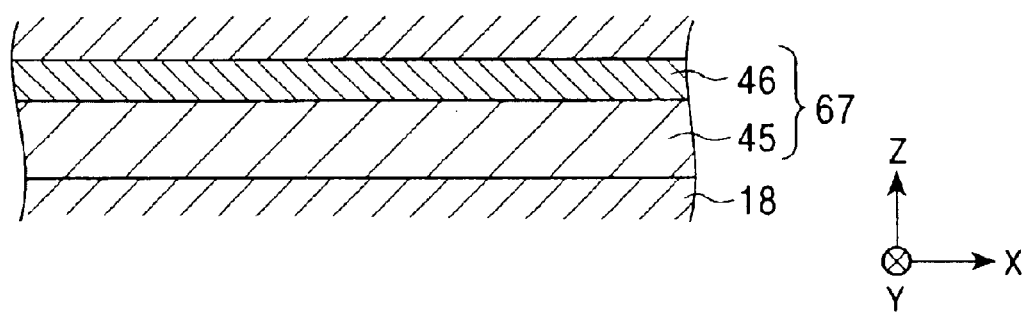
FIG. 14 is a partial sectional view of another form of a free magnetic layer of the present invention under magnification, viewed from the side of the surface facing a recording medium.

FIG. 14 is a partial sectional view showing another form of the free magnetic layer 67 of the present invention under magnification.

The free magnetic layer 67 shown in FIG. 14 has a laminated structure composed of a magnetic layer 45 and a backed layer 46. The aforementioned backed layer 46 is formed from, for example, Cu, Au, Cr and Ru. The aforementioned magnetic layer 45 is formed from a magnetic material, for example, a NiFe alloy, a CoFe alloy, a CoFeNi alloy, Co and a CoNi alloy.

When the aforementioned backed layer 46 is arranged, the mean free path of the conductive electron having an up spin which contributes to the magnetoresistance effect is increased, a large rate of change in the resistance is attained due to a so-called spin filter effect in a spin valve type magnetic element, and therefore, it becomes possible to respond to an increase in the packing density. Since the aforementioned backed layer 46 also has a function of transmitting an exchange coupling, the exchange coupling between the second antiferromagnetic layer 22 and the magnetic layer 45 can be maintained at an adequate value, although the value is somewhat reduced.

Figure 15:
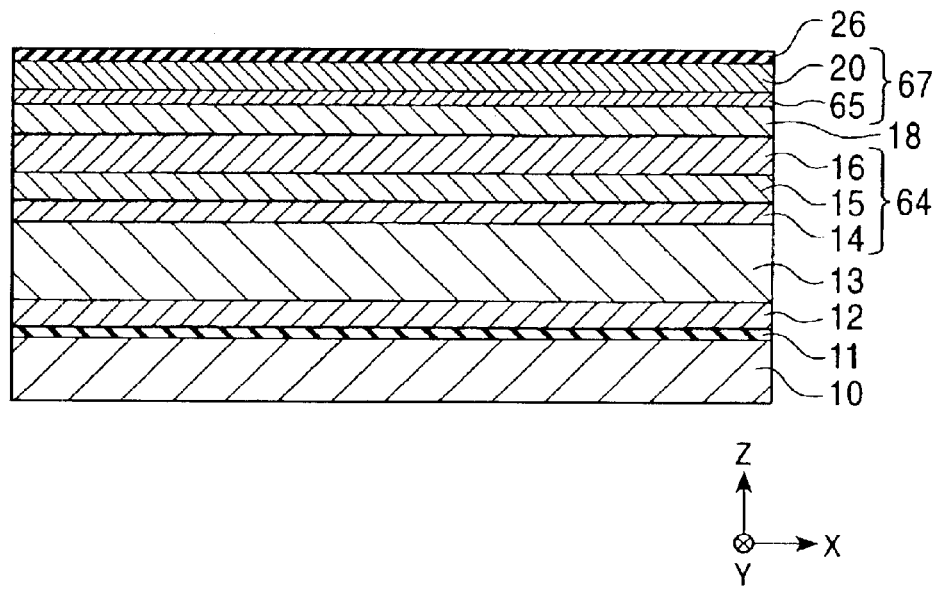
FIG. 15 is a diagram showing one step in a manufacturing process of the magnetic sensing element in the form shown in FIG. 1.
Figure 16:
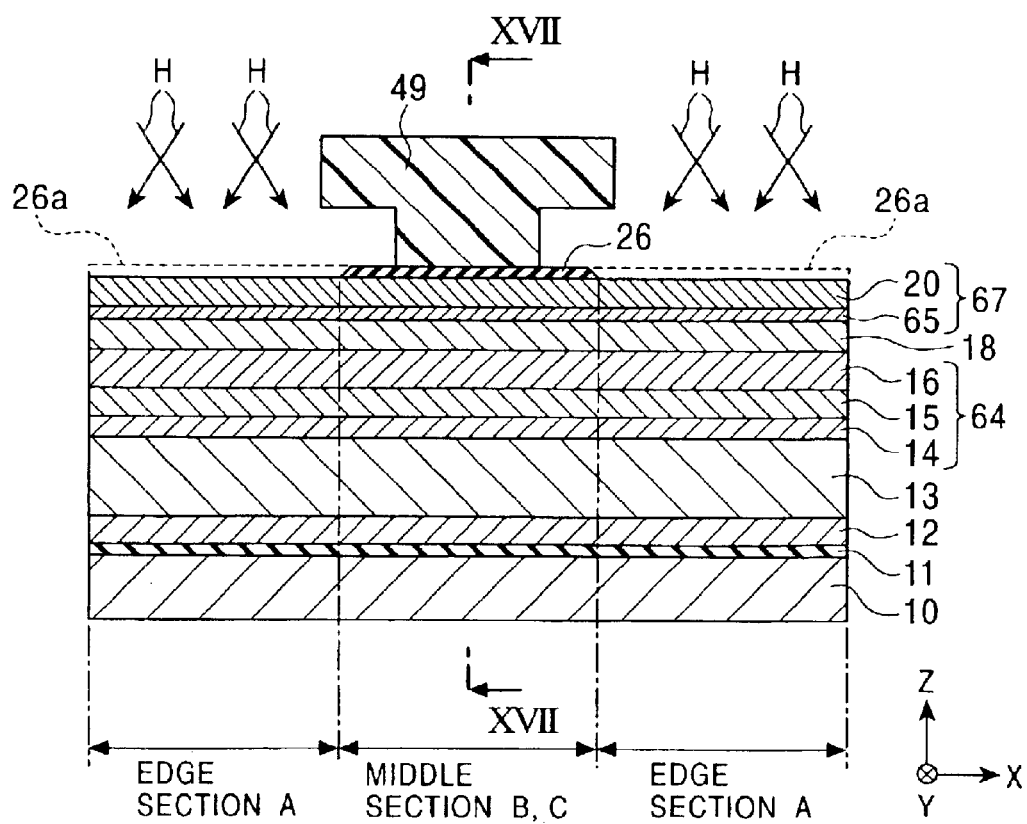
FIG. 16 is a diagram showing one step performed following the step shown in FIG. 15.
Figure 17:
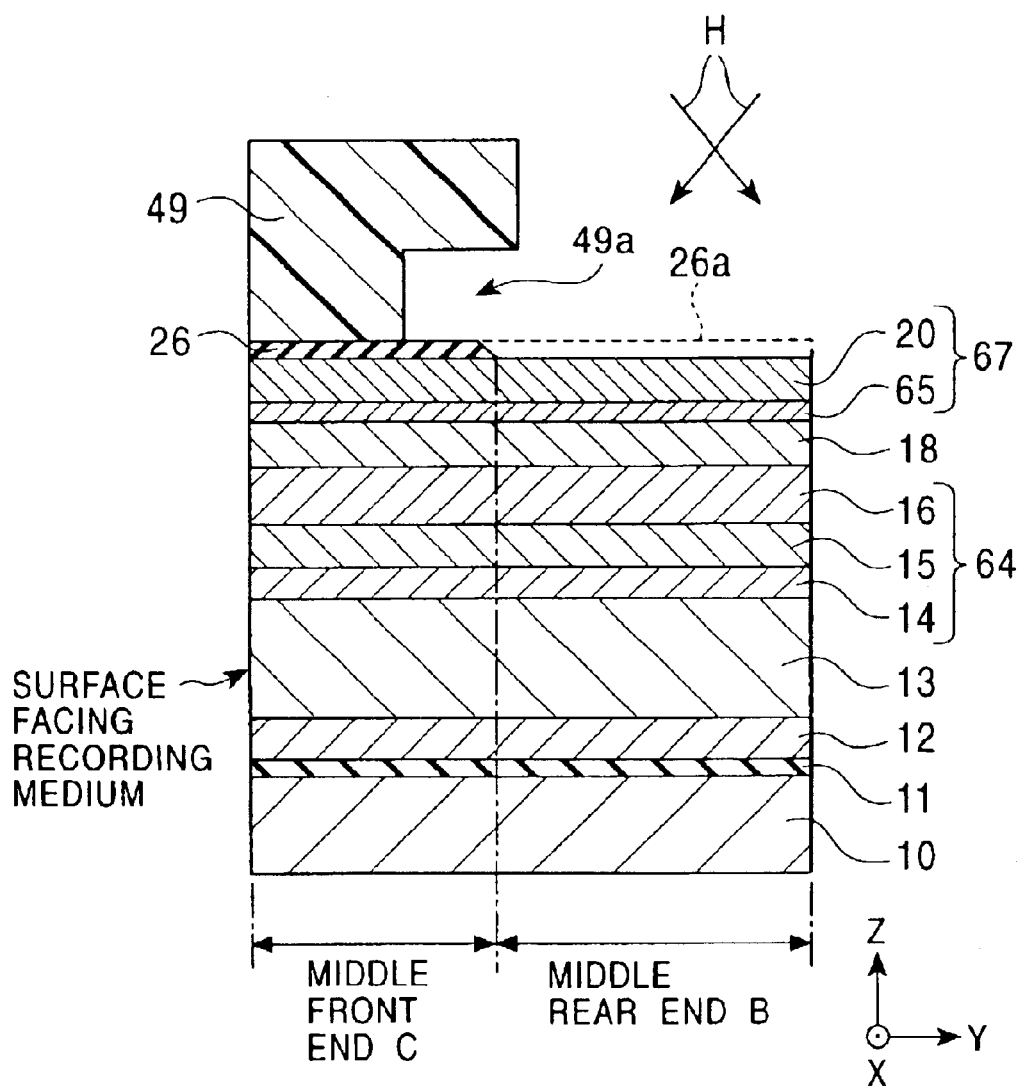
FIG. 17 is a partial vertical sectional view of the magnetic sensing element during a manufacturing step shown in FIG. 16, while the magnetic sensing element is cut from the line XVII—XVII to the height direction and is viewed from the direction indicated by arrows.
Figure 18:
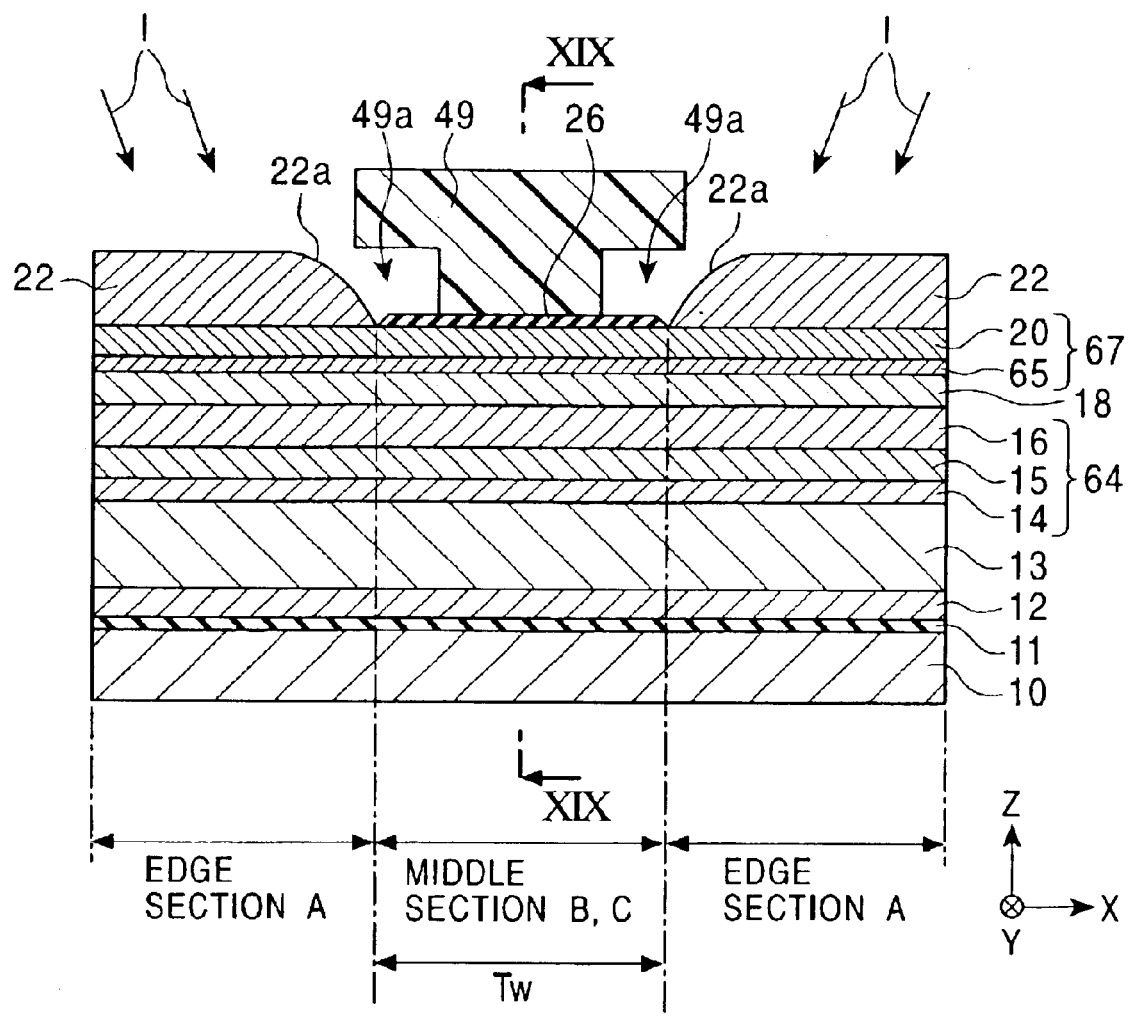
FIG. 18 is a diagram showing one step performed following the step shown in FIG. 16.
Figure 19:
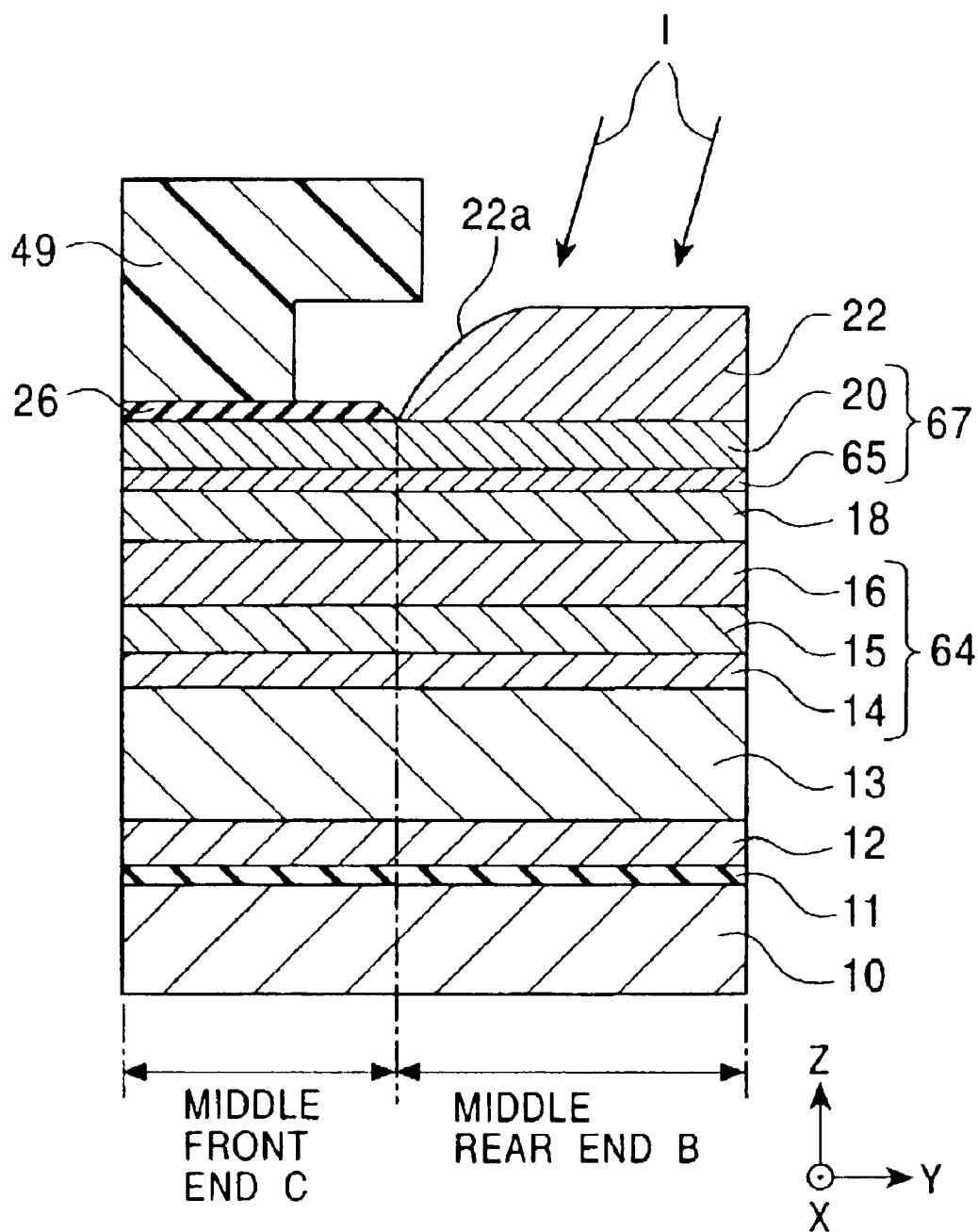
FIG. 19 is a partial vertical sectional view of the magnetic sensing element during a manufacturing step shown in FIG. 18, while the magnetic sensing element is cut from the line XIX—XIX to the height direction and is viewed from the direction indicated by arrows.
Figure 20:
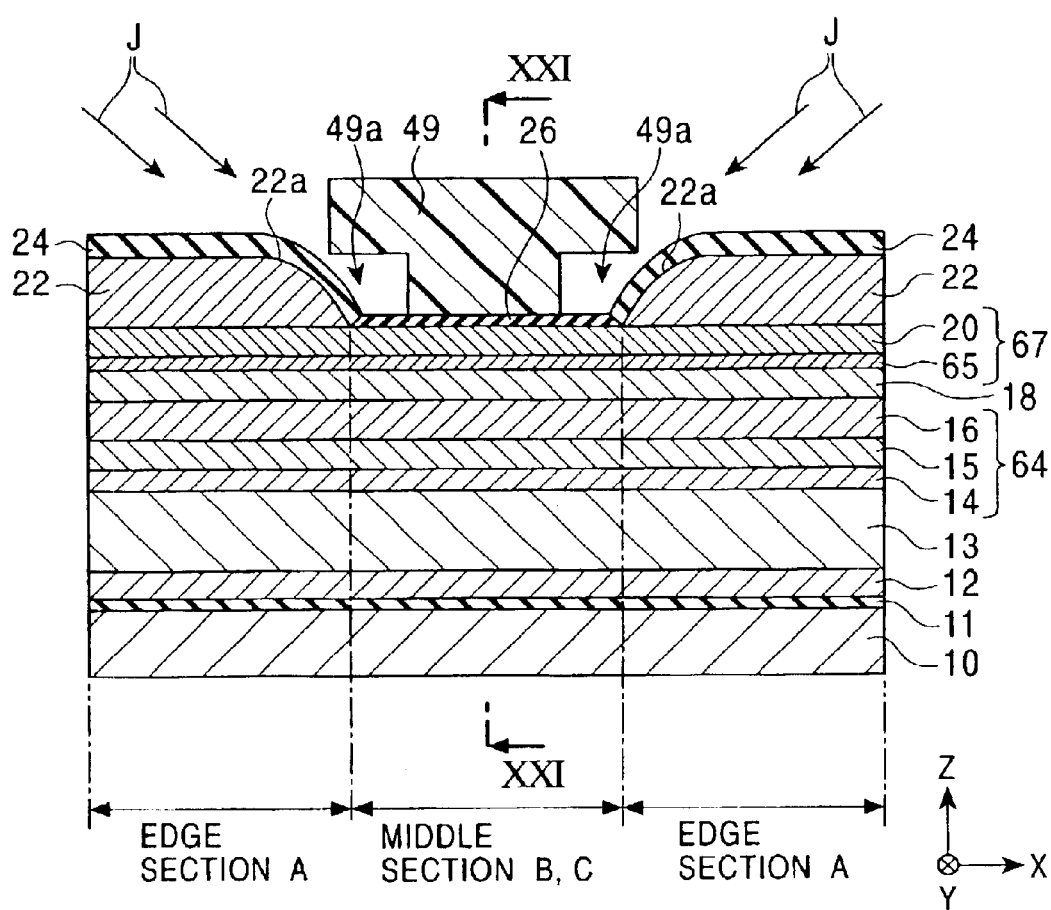
FIG. 20 is a diagram showing one step performed following the step shown in FIG. 18.
Figure 21:
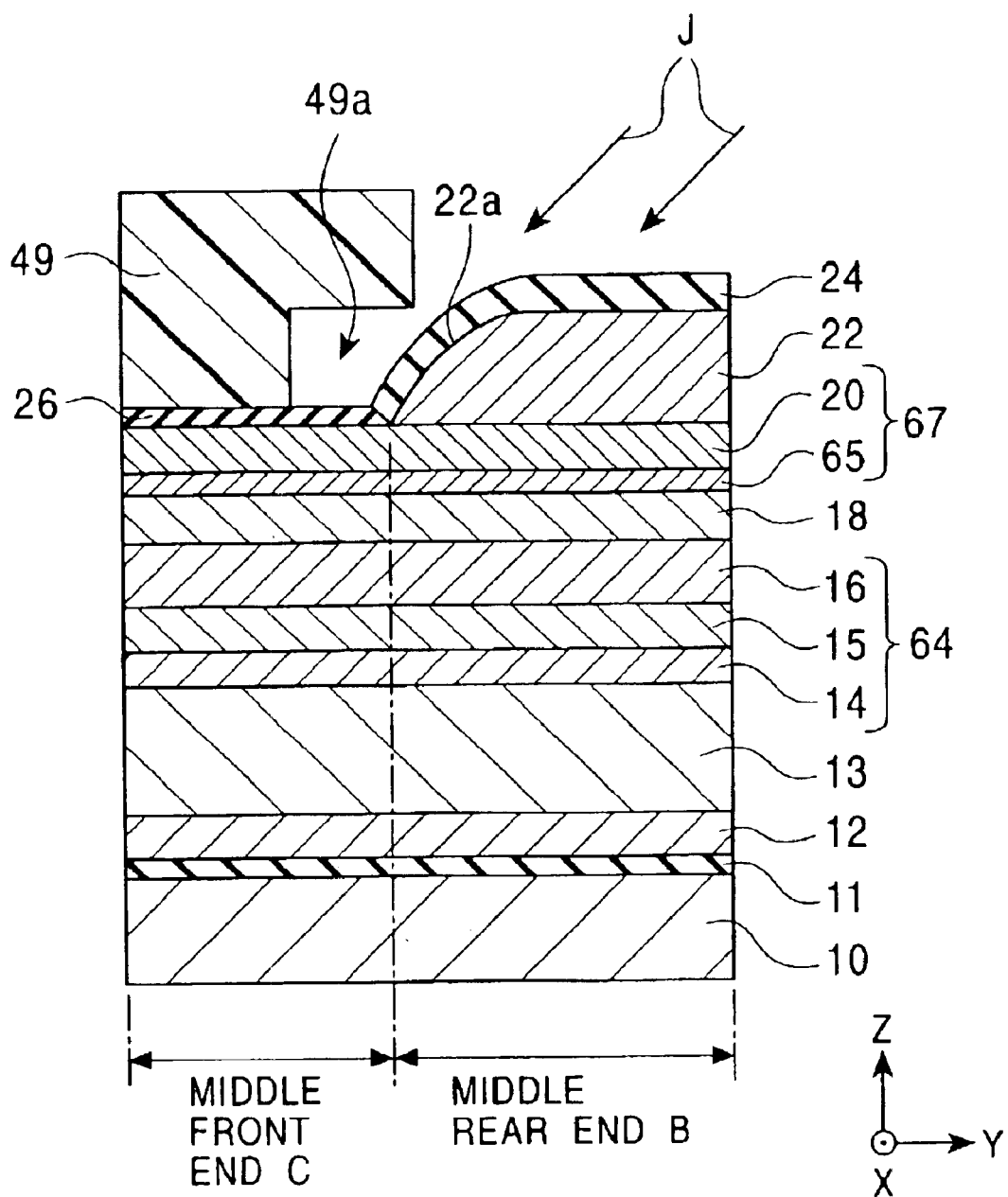
FIG. 21 is a partial vertical sectional view of the magnetic sensing element during a manufacturing step shown in FIG. 20, while the magnetic sensing element is cut from the line XXI—XXI to the height direction and is viewed from the direction indicated by arrows.

Each of FIG. 15 to FIG. 21 is a diagram showing one step in a manufacturing process of the magnetic sensing element shown in FIG. 1. Each of FIGS. 15, 16, 18 and 20 is a partial sectional view showing the step viewed from the side of the surface facing a recording medium. FIG. 17 is a partial vertical sectional view of the magnetic sensing element during a manufacturing step shown in FIG. 16, while the magnetic sensing element is cut from the line XVII—XVII to the height direction and is viewed from the direction indicated by arrows. FIG. 19 is a partial vertical sectional view of the magnetic sensing element during a manufacturing step shown in FIG. 18, while the magnetic sensing element is cut from the line XIX—XIX to the height direction and is viewed from the direction indicated by arrows. FIG. 21 is a partial vertical sectional view of the magnetic sensing element during a manufacturing step shown in FIG. 20, while the magnetic sensing element is cut from the line XXI—XXI to the height direction and is viewed from the direction indicated by arrows.

In the step shown in FIG. 15, a substrate layer 11, a seed layer 12, a first antiferromagnetic layer 13, a pinned magnetic layer 64, a non-magnetic material layer 18, a free magnetic layer 67 and a non-magnetic layer 26 are continuously formed on a lower shield layer 10. A sputtering or evaporation method is used for the film formation. The pinned magnetic layer 64 shown in FIG. 15 has the laminated ferrimagnetic structure composed of a second magnetic layer 14 and a first magnetic layer 16, each formed from, for example, a CoFe alloy, and a non-magnetic intermediate layer 15 made of Ru or the like, interposing between both the magnetic layers 14 and 16. The aforementioned free magnetic layer 67 has a laminated structure composed of a diffusion prevention layer 65 made of a CoFe alloy or the like and a magnetic material layer 20 made of a NiFe alloy or the like.

In the present invention, preferably, the aforementioned first antiferromagnetic layer 13 is formed from a PtMn alloy, X—Mn (where X represents at least one element selected from the group consisting of Pd, Ir, Rh, Ru, Os, Ni and Fe) alloy or a Pt—Mn—X' (where X' represents at least one element selected from the group consisting of Pd, Ir, Rh, Ru, Au, Ag, Os, Cr, Ni, Ar, Ne, Xe and Kr) alloy.

In the aforementioned PtMn alloy or the alloy represented by the aforementioned formula X—Mn, preferably, Pt or X is within the range of 37 at % or more, but 63 at % or less. In the aforementioned PtMn alloy or the alloy represented by the aforementioned formula X—Mn, more preferably, Pt or X is within the range of 47 at % or more, but 57 at % or less.

In the alloy represented by the formula Pt—Mn—X', preferably, X'+Pt is within the range of 37 at % or more, but 63 at % or less. In the alloy represented by the aforementioned formula Pt—Mn—X', more preferably, X'+Pt is within the range of 47 at % or more, but 57 at % or less. Furthermore, in the alloy represented by the aforementioned formula Pt—Mn—X', preferably, X' is within the range of 0.2 at % or more, but 10 at % or less. However, when X' is at least one element selected from the group consisting of Pd, Ir, Rh, Ru, Os, Ni and Fe, preferably, X' is within the range of 0.2 at % or more, but 40 at % or less.

In the present invention, preferably, the aforementioned first antiferromagnetic layer 13 is formed to have a film thickness of 80 angstroms or more, but 300 angstroms or less. When the aforementioned first antiferromagnetic layer 13 is formed to have such a degree of large film thickness, a large exchange coupling magnetic field can be generated between the aforementioned first antiferromagnetic layer 13 and the magnetic layer 14 of the pinned magnetic layer 64 by magnetic annealing. Specifically, the exchange coupling magnetic field of 48 kA/m or more, for example, more than 64 kA/m, can be generated.

When the non-magnetic layer 26 is arranged on the aforementioned free magnetic layer 67 as in the step of FIG. 15, even if the multilayer film shown in FIG. 15 is exposed to the atmosphere, the aforementioned free magnetic layer 67 can be properly prevented from being oxidized.

Here, the aforementioned non-magnetic layer 26 must be a dense layer unlikely to be oxidized by exposure to the atmosphere. The material therefor must not degrade the property as the antiferromagnetic layer even when elements constituting the aforementioned non-magnetic layer 26 enter into the second antiferromagnetic layer 22 formed in a later step due to thermal diffusion or the like.

In the present invention, preferably, the aforementioned non-magnetic layer 26 is formed from at least one noble metal selected from the group consisting of Ru, Re, Pd, Os, Ir, Pt, Au and Rh.

The non-magnetic layer 26 made of a noble metal, for example, Ru, is a dense layer unlikely to be oxidized by exposure to the atmosphere. Therefore, even when the film thickness of the aforementioned non-magnetic layer 26 is reduced, the free magnetic layer 67 can be properly prevented from being oxidized by exposure to the atmosphere.

In the present invention, preferably, the aforementioned non-magnetic layer 26 is formed to have the film thickness of 3 angstroms or more, but 10 angstroms or less. Even the non-magnetic layer 26 having such a degree of small film thickness can properly prevent the aforementioned free magnetic layer 67 from being oxidized by exposure to the atmosphere.

As shown in FIG. 15, individual layers up to non-magnetic layer 26 are laminated on the lower shield layer 10, and subsequently, the first magnetic annealing is applied. A heat treatment is performed at the first heat treatment temperature while the first magnetic field is applied in the direction (the Y direction shown in the drawing) orthogonal to the track width Tw (the X direction shown in the drawing). Consequently, an exchange coupling magnetic field is generated between the first antiferromagnetic layer 13 and the second magnetic layer 14 constituting the pinned magnetic layer 64, and the magnetization of the aforementioned second magnetic layer 14 is pinned in the Y direction shown in the drawing. The magnetization of the other magnetic layer 16 is pinned in the direction opposite to the Y direction shown in the drawing by an exchange coupling due to an RKKY interaction which takes place with respect to the aforementioned second magnetic layer 14. For example, the aforementioned first heat treatment temperature is specified to be 270° C., and the magnitude of the magnetic field is specified to be 800 kA/m.

In the step shown in FIG. 16, a resist layer is formed on the top surface of the aforementioned non-magnetic layer 26, this resist layer is subjected to exposure and development, and thereby, a resist layer 49 in the shape shown in FIG. 16 is allowed to remain on the aforementioned non-magnetic layer 26. The aforementioned resist layer 49 is a resist layer for lift off, for example.

The aforementioned resist layer 49 is formed simply on the middle front end C of the non-magnetic layer 26, as shown in FIG. 16 and FIG. 17.

Both edge sections 26a and a middle rear end 26b of the aforementioned non-magnetic layer 26, which are not covered with the aforementioned resist layer 49, are cut away by ion milling from the direction indicated by arrows H shown in FIG. 16 and FIG. 17 (parts of the non-magnetic layer 26 indicated by a dotted line shown in FIG. 16 and FIG. 17 are removed).

The reason both the edge sections 26a and the middle rear end 26b of the aforementioned non-magnetic layer 26 are cut away is that an exchange coupling is thereby properly generated between the second antiferromagnetic layer 22 formed in the following step and the free magnetic layer 67.

A part of both the edge sections 26a and the middle rear end 26b of the aforementioned non-magnetic layer 26 may be allowed to remain. In the present invention, preferably, the film thicknesses of both the edge sections 26a and the middle rear end 26b of the aforementioned non-magnetic layer 26 are 3 angstroms or less. When the film thicknesses of both the edge sections 26a and the middle rear end 26b of the aforementioned non-magnetic layer 26 are reduced to such a degree, a proper magnitude of exchange coupling magnetic field can be generated between the second antiferromagnetic layer 22 and the free magnetic layer 67.

In the ion milling step shown in FIG. 16, low energy ion milling can be used. This is because the aforementioned non-magnetic layer 26 is formed to have a very small film thickness in the order of 3 angstroms or more, but 10 angstroms or less, in the film formation stage.

In the present invention, the non-magnetic layer 26 formed from Ru or the like has a small film thickness in the order of 3 angstroms or more, but 10 angstroms or less in the film formation stage. Therefore, the milling is controlled with ease because of the low energy ion milling, so that the milling is stopped partway in the aforementioned non-magnetic layer 26.

Subsequently, the step shown in FIG. 18 and FIG. 19 is performed. In the step shown in FIG. 18 and FIG. 19, the second antiferromagnetic layers 22 are formed on both the edge sections A and the middle rear end B of the aforementioned free magnetic layer 67, on which the aforementioned resist layer 49 is not arranged, by a sputtering method or an evaporation method from the direction indicated by arrows I. The inner edge surfaces 22a of the aforementioned second antiferromagnetic layer 22 are formed into curved surfaces or inclined surfaces in order that the distance from the middle front end C is gradually increased as the location on the inner edge surface 22a is changed from the bottom surface toward the top surface. In the present embodiment, a track width Tw is defined as the spacing between the bottom surfaces of the aforementioned second antiferromagnetic layers 22 arranged on both the edge sections A of the free magnetic layer 67.

In the present invention, preferably, the aforementioned second antiferromagnetic layer 22 is formed from a PtMn alloy, X—Mn (where X represents at least one element selected from the group consisting of Pd, Ir, Rh, Ru, Os, Ni and Fe) alloy or a Pt—Mn—X' (where X' represents at least one element selected from the group consisting of Pd, Ir, Rh, Ru, Au, Ag, Os, Cr, Ni, Ar, Ne, Xe and Kr) alloy.

In the aforementioned PtMn alloy or the alloy represented by the aforementioned formula X—Mn, preferably, Pt or X is within the range of 37 at % or more, but 63 at % or less. In the aforementioned PtMn alloy or the alloy represented by the aforementioned formula X—Mn, more preferably, Pt or X is within the range of 47 at % or more, but 57 at % or less.

In the alloy represented by the formula Pt—Mn—X', preferably, X'+Pt is within the range of 37 at % or more, but 63 at % or less. In the alloy represented by the aforementioned formula Pt—Mn—X', more preferably, X'+Pt is within the range of 47 at % or more, but 57 at % or less. Furthermore, in the alloy represented by the aforementioned formula Pt—Mn—X', preferably, X' is within the range of 0.2 at % or more, but 10 at % or less. However, when X' is at least one element selected from the group consisting of Pd, Ir, Rh, Ru, Os, Ni and Fe, preferably, X' is within the range of 0.2 at % or more, but 40 at % or less.

In the step shown in FIG. 18, preferably, the aforementioned second antiferromagnetic layer 22 is formed to have a film thickness of 80 angstroms or more, but 300 angstroms or less.

Regarding the film formation angle in the formation of the aforementioned second antiferromagnetic layers 22, the direction perpendicular to the surface of the free magnetic layer 67 or the direction inclined at some angle from the aforementioned perpendicular direction is preferable. When the aforementioned film formation angle is specified to be such an angle that the direction is somewhat inclined from the aforementioned perpendicular direction, the aforementioned second antiferromagnetic layer 22 can also be formed with ease in a dent 49a arranged under the aforementioned resist layer 49, and therefore, it is possible to respond to a narrower track. In addition, the inner edge surfaces 22a of the aforementioned second antiferromagnetic layer 22 can be formed into inclined surfaces or curved surfaces.

In the step shown in FIG. 20 and FIG. 21, an insulating layer 24 made of an insulating material, for example, $Al_2O_3$ and $SiO_2$, is arranged on the aforementioned second antiferromagnetic layer 22 by a sputtering or evaporation method. In this step, the aforementioned insulating layer 24 is formed by sputtering or the like from the direction indicated by arrows J. At this time, the film formation angle is specified to be such an angle that the direction is more inclined from the direction perpendicular to the surface of the free magnetic layer 67 (the Z direction shown in the drawing) compared with the film formation angle in the step shown in FIG. 18 and FIG. 19 for forming the second antiferromagnetic layer 22. Consequently, the aforementioned insulating layer 24 is not only formed on the aforementioned second antiferromagnetic layer 22, but also allowed to overlap the non-magnetic layer 26 arranged on the free-magnetic layer 67 in the middle front end C. In this manner, the inner edge surfaces 22a of the aforementioned second antiferromagnetic layer 22 become in a condition of being completely covered with the aforementioned insulating layer 24. Subsequently, the aforementioned resist layer 49 is removed.

The second magnetic annealing is applied. The direction of the magnetic field at this time is the track-width direction (the X direction shown in the drawing). In this second magnetic annealing, the second applied magnetic field is made to be smaller than the exchange-anisotropic magnetic field of the first antiferromagnetic layer 13, and in addition, the heat treatment temperature is made to be lower than the blocking temperature of the aforementioned first antiferromagnetic layer 13. In this manner, the exchange-anisotropic magnetic field of the aforementioned second antiferromagnetic layer 22 can be directed in the track-width direction (the X direction shown in the drawing) while the direction of the exchange-anisotropic magnetic field of the aforementioned first antiferromagnetic layer 13 is directed in the height direction (the Y direction shown in the drawing). The second heat treatment temperature is, for example, 250° C., and the magnitude of the magnetic field is 24 kA/m.

By the aforementioned second magnetic annealing, an exchange coupling magnetic field is generated between the aforementioned second antiferromagnetic layer 22 and the free magnetic layer 67, and both the edge sections A and the middle rear end B of the aforementioned free magnetic layer 67 are magnetized, followed by pinning, in the track-width direction (the X direction shown in the drawing). On the other hand, the middle front end C of the aforementioned free magnetic layer 67 is weakly brought into a single domain condition in the track-width direction (the X direction shown in the drawing) to the extent that magnetic reversal can be brought about with respect to an external magnetic field.

It is considered that in the aforementioned second magnetic annealing, noble metal elements, for example, Ru, constituting the non-magnetic layer 26 diffuse into the second antiferromagnetic layer 22, and a composition containing the elements in the aforementioned non-magnetic layer 26 is brought about in the vicinity of the bottom surface of the aforementioned second antiferromagnetic layer 22 (for example, when the second antiferromagnetic layer 22 is formed from a PtMn alloy, and the non-magnetic layer 26 is Ru, the composition in the vicinity of the bottom surface of the aforementioned second antiferromagnetic layer 22 becomes PtMnRu). However, even when the compositional element is contained, as described above, the property of the aforementioned second antiferromagnetic layer 22 as the antiferromagnetic material is not lost, and a large exchange coupling magnetic field can be generated between the aforementioned second antiferromagnetic layer 22 and the free magnetic layer 67.

After the aforementioned second magnetic annealing is applied, an upper shield layer 66 made of a magnetic material is formed over the aforementioned insulating layer 24 and the non-magnetic layer 26 arranged on the middle front end C of the free magnetic layer 67 by a plating method or the like.

The magnetic sensing element shown in FIG. 1 can be manufactured by the manufacturing process described above. The manufacture of the magnetic sensing element shown in FIG. 4 can be achieved by making the film formation angle during the formation of the aforementioned insulating layer 24 in the step shown in FIG. 20 and FIG. 21 equivalent to the film formation angle in, e.g. the step shown in FIG. 18 and FIG. 19 for forming the second antiferromagnetic layer 22.

Figure 23:
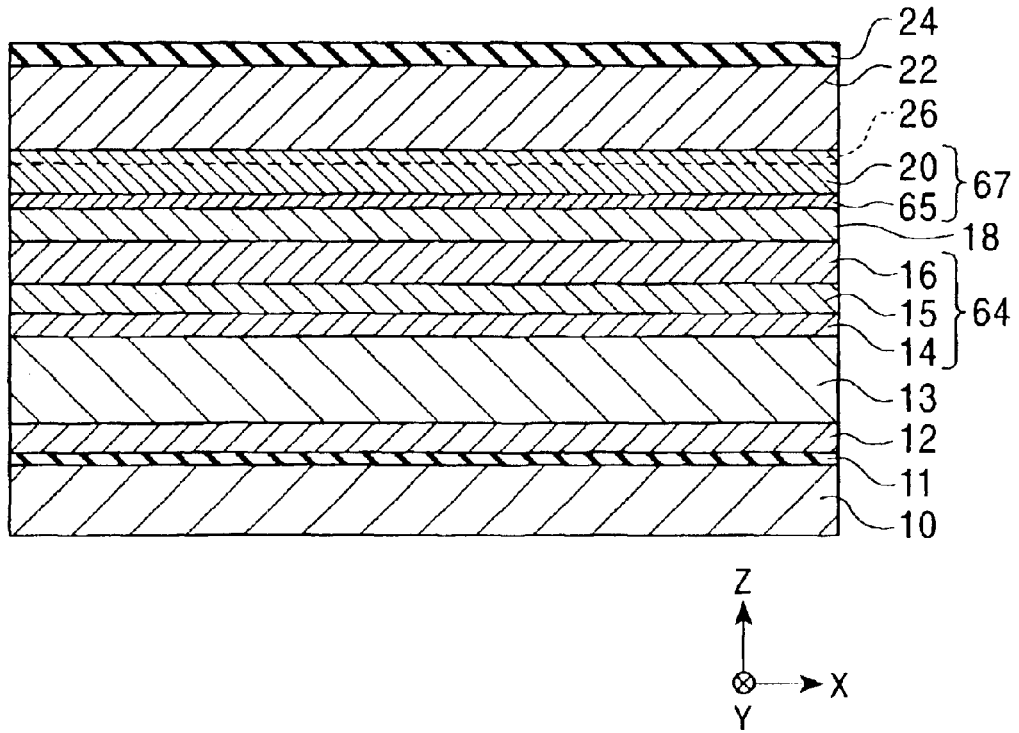
FIG. 23 is a diagram showing one step performed following the step shown in FIG. 22.
Figure 24:
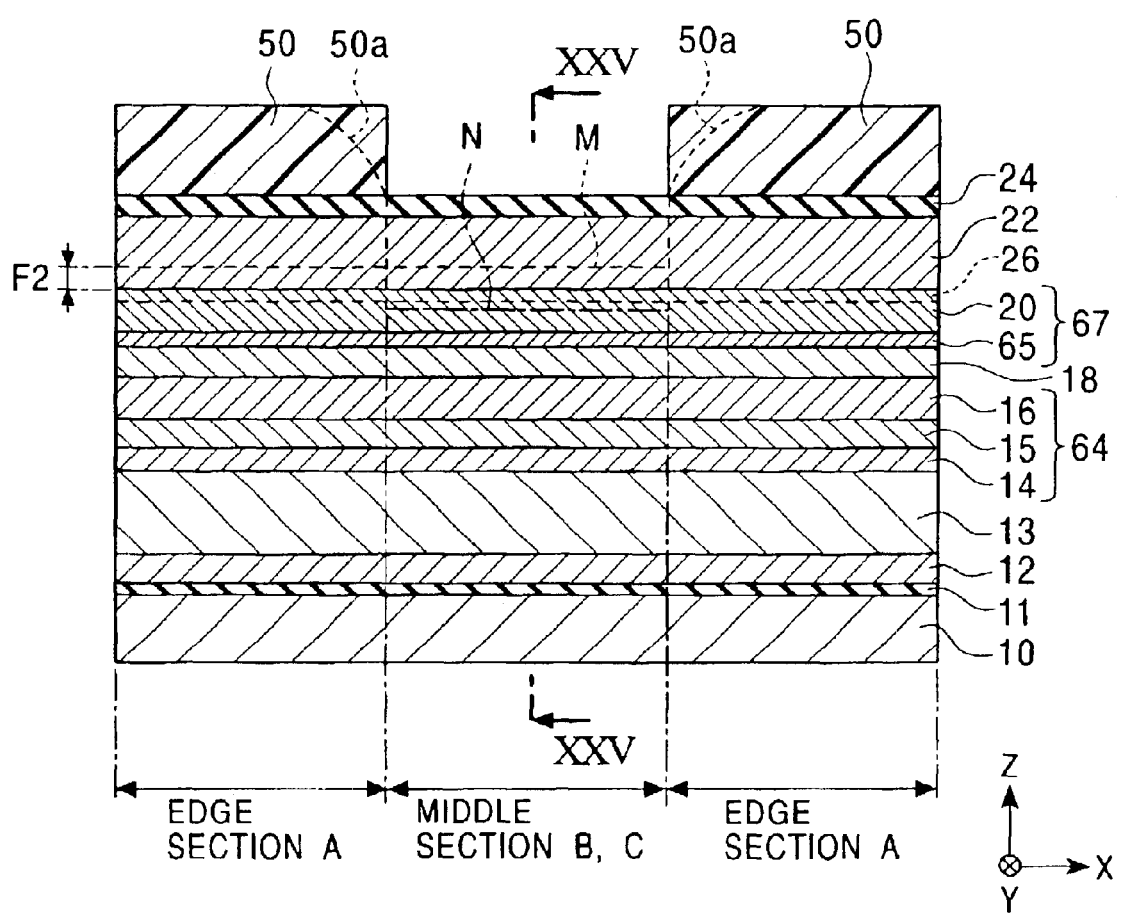
FIG. 24 is a diagram showing one step performed following the step shown in FIG. 23.
Figure 25:
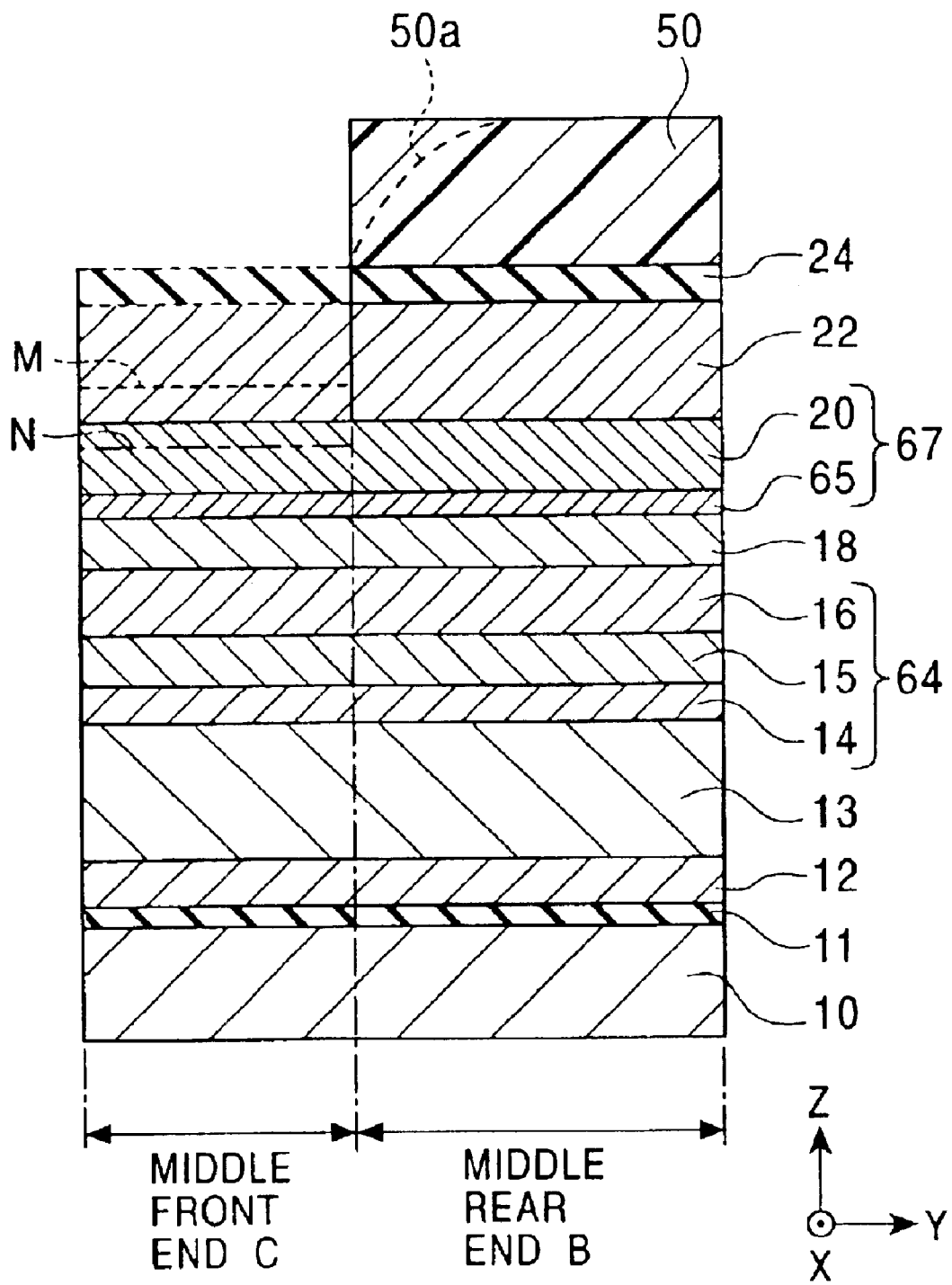
FIG. 25 is a partial vertical sectional view of a magnetic sensing element during a manufacturing step shown in FIG. 24, while the magnetic sensing element is cut from the line XXV—XXV to the height direction and is viewed from the direction indicated by arrows.

Each of FIG. 22 to FIG. 25 is a diagram showing one step in a manufacturing process of the magnetic sensing element shown in FIG. 5 and FIG. 6. Each of FIG. 22 to FIG. 25 is a partial sectional view showing the step, viewed from the side of the surface facing the recording medium. FIG. 25 is a partial vertical sectional view of the magnetic sensing element during a manufacturing step shown in FIG. 24, while the magnetic sensing element is cut from the line XXV—XXV to the height direction and is viewed from the direction indicated by arrows.

Figure 22:
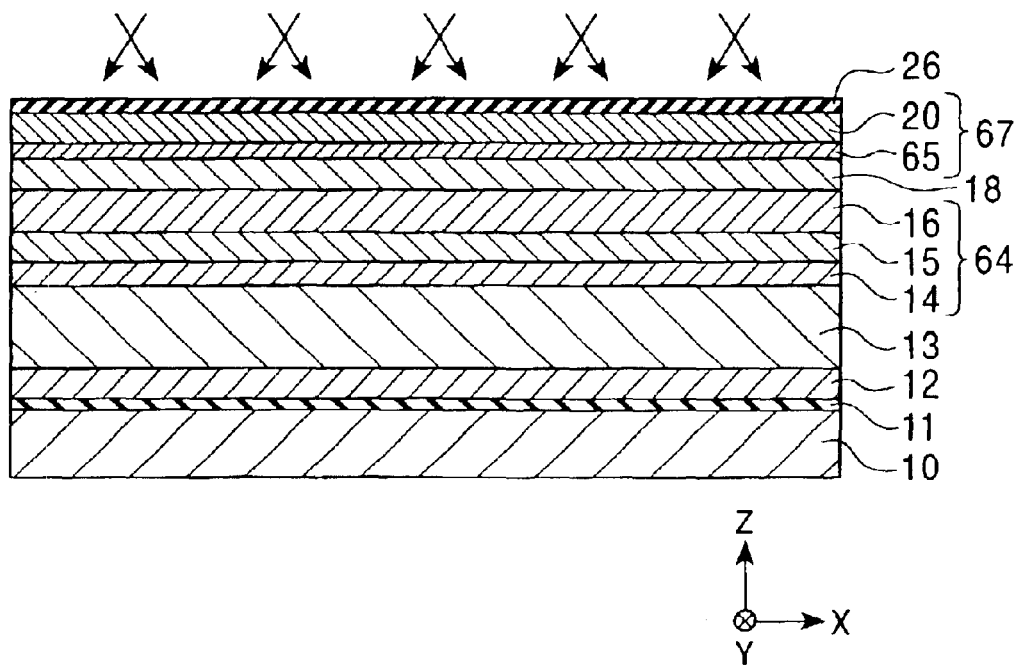
FIG. 22 is a diagram showing one step in each of manufacturing processes of the magnetic sensing elements in the respective forms shown in FIGS. 5 and 6.

In the step shown in FIG. 22, a substrate layer 11, a seed layer 12, a first antiferromagnetic layer 13, a pinned magnetic layer 64, a non-magnetic material layer 18, a free magnetic layer 67 and a non-magnetic layer 26 are continuously formed on a lower shield layer 10. A sputtering or evaporation method is used for the film formation. The pinned magnetic layer 64 shown in FIG. 22 has the laminated ferrimagnetic structure composed of a second magnetic layer 14 and a first magnetic layer 16, each formed from, for example, a CoFe alloy, and a non-magnetic intermediate layer 15 made of Ru or the like, interposing between both the magnetic layers 14 and 16. The aforementioned free magnetic layer 67 has a laminated structure composed of a diffusion prevention layer 65 made of a CoFe alloy or the like and a magnetic material layer 20 made of a NiFe alloy or the like.

In the present invention, preferably, the aforementioned first antiferromagnetic layer 13 is formed from a PtMn alloy, X—Mn (where X represents at least one element selected from the group consisting of Pd, Ir, Rh, Ru, Os, Ni and Fe) alloy or a Pt—Mn—X' (where X' represents at least one element selected from the group consisting of Pd, Ir, Rh, Ru, Au, Ag, Os, Cr, Ni, Ar, Ne, Xe and Kr) alloy.

In the aforementioned PtMn alloy or the alloy represented by the aforementioned formula X—Mn, preferably, Pt or X is within the range of 37 at % or more, but 63 at % or less. In the aforementioned PtMn alloy or the alloy represented by the aforementioned formula X—Mn, more preferably, Pt or X is within the range of 47 at % or more, but 57 at % or less.

In the alloy represented by the formula Pt—Mn—X', preferably, X'+Pt is within the range of 37 at % or more, but 63 at % or less. In the alloy represented by the aforementioned formula Pt—Mn—X', more preferably, X'+Pt is within the range of 47 at % or more, but 57 at % or less. Furthermore, in the alloy represented by the aforementioned formula Pt—Mn—X', preferably, X' is within the range of 0.2 at % or more, but 10 at % or less. However, when X' is at least one element selected from the group consisting of Pd, Ir, Rh, Ru, Os, Ni and Fe, preferably, X' is within the range of 0.2 at % or more, but 40 at % or less.

In the present invention, preferably, the aforementioned first antiferromagnetic layer 13 is formed to have a film thickness of 80 angstroms or more, but 300 angstroms or less. When the aforementioned first antiferromagnetic layer 13 is formed to have such a degree of large film thickness, a large exchange coupling magnetic field can be generated between the aforementioned first antiferromagnetic layer 13 and the magnetic layer 14 constituting the pinned magnetic layer 64 by magnetic annealing. Specifically, the exchange coupling magnetic field of 48 kA/m or more, for example, more than 64 kA/m, can be generated.

When the non-magnetic layer 26 is arranged on the aforementioned free magnetic layer 67 as in the step shown in FIG. 22, even if the multilayer film shown in FIG. 22 is exposed to the atmosphere, the aforementioned free magnetic layer 67 can be properly prevented from being oxidized.

Here, the aforementioned non-magnetic layer 26 must be a dense layer unlikely to be oxidized by exposure to the atmosphere. In the present invention, preferably, the aforementioned non-magnetic layer 26 is formed from at least one noble metal selected from the group consisting of Ru, Re, Pd, Os and Ir.

The non-magnetic layer 26 made of a noble metal, for example, Ru, is a dense layer unlikely to be oxidized by exposure to the atmosphere. Therefore, even when the film thickness of the aforementioned non-magnetic layer 26 is reduced, the aforementioned free magnetic layer 67 can be properly prevented from being oxidized by exposure to the atmosphere.

In the present invention, preferably, the aforementioned non-magnetic layer 26 is formed to have the film thickness of 3 angstroms or more, but 10 angstroms or less. Even the non-magnetic layer 26 having such a degree of small film thickness can properly prevent the aforementioned free magnetic layer 67 from being oxidized by exposure to the atmosphere.

As shown in FIG. 22, individual layers up to non-magnetic layer 26 are laminated, and subsequently, the first magnetic annealing is applied. A heat treatment is performed at the first heat treatment temperature while the first magnetic field is applied in the direction (the Y direction shown in the drawing) orthogonal to the track width Tw (the X direction shown in the drawing). Consequently, an exchange coupling magnetic field is generated between the first antiferromagnetic layer 13 and the second magnetic layer 14 constituting the pinned magnetic layer 64, and the magnetization of the aforementioned second magnetic layer 14 is thereby pinned in the Y direction shown in the drawing. The magnetization of the other magnetic layer 16 is pinned in the direction opposite to the Y direction shown in the drawing by an exchange coupling due to an RKKY interaction which takes place with respect to the aforementioned second magnetic layer 14. For example, the aforementioned first heat treatment temperature is specified to be 270° C., and the magnitude of the magnetic field is specified to be 800 kA/m.

The whole surface of the aforementioned non-magnetic layer 26 is cut away by applying ion milling in the step shown in FIG. 22. All of the aforementioned non-magnetic layer 26 may be cut away at this time, but a part of the layer may be allowed to remain. The reason the surface of the aforementioned non-magnetic layer 26 is cut away is that a proper magnitude of exchange coupling cannot be generated between the aforementioned free magnetic layer 67 and the second antiferromagnetic layer 22 formed in the following step unless the film thickness of the aforementioned non-magnetic layer 26 is reduced as small as possible.

In the present invention, preferably, the film thickness of the aforementioned non-magnetic layer 26 is made to be 3 angstroms or less in this ion milling step.

In the ion milling step shown in FIG. 22, low energy ion milling can be used. This is because the aforementioned non-magnetic layer 26 is formed to have a very small film thickness in the order of 3 angstroms or more, but 10 angstroms or less, in the film formation stage. Consequently, in the present invention, the milling can be easily stopped partway in the aforementioned non-magnetic layer 26 because of the low energy ion milling. Even when all of the aforementioned non-magnetic layer 26 is cut away, the problem of ion milling damage to the aforementioned free magnetic layer 67 can be reduced.

In the step shown in FIG. 23, the second antiferromagnetic layer 22 is formed on the aforementioned non-magnetic layer 26, and successively, the insulating layer 24 formed from $Al_2O_3$, $SiO_2$ or the like is arranged on the aforementioned second antiferromagnetic layer 22.

Preferably, the aforementioned second antiferromagnetic layer 22 is formed from a PtMn alloy, X—Mn (where X represents at least one element selected from the group consisting of Pd, Ir, Rh, Ru, Os, Ni and Fe) alloy or a Pt—Mn—X' (where X' represents at least one element selected from the group consisting of Pd, Ir, Rh, Ru, Au, Ag, Os, Cr, Ni, Ar, Ne, Xe and Kr) alloy.

In the aforementioned PtMn alloy or the alloy represented by the aforementioned formula X—Mn, preferably, Pt or X is within the range of 37 at % or more, but 63 at % or less. In the aforementioned PtMn alloy or the alloy represented by the aforementioned formula X—Mn, more preferably, Pt or X is within the range of 47 at % or more, but 57 at % or less.

In the alloy represented by the formula Pt—Mn—X', preferably, X'+Pt is within the range of 37 at % or more, but 63 at % or less. In the alloy represented by the aforementioned formula Pt—Mn—X', more preferably, X'+Pt is within the range of 47 at % or more, but 57 at % or less. Furthermore, in the alloy represented by the aforementioned formula Pt—Mn—X', preferably, X' is within the range of 0.2 at % or more, but 10 at % or less. However, when X' is at least one element selected from the group consisting of Pd, Ir, Rh, Ru, Os, Ni and Fe, preferably, X' is within the range of 0.2 at % or more, but 40 at % or less.

In the step shown in FIG. 23, preferably, the aforementioned second antiferromagnetic layer 22 is formed to have a film thickness of 80 angstroms or more, but 300 angstroms or less.

In addition, the following step slightly different from the aforementioned step shown in FIG. 22 and FIG. 23 may be used. When the following step is used, the exchange coupling magnetic field generated between the second antiferromagnetic layer 22 and the free magnetic layer 67 can be somewhat enhanced.

Continuous film formation up to the free magnetic layer 67 is performed in the step shown in FIG. 22, and thereafter, an antiferromagnetic layer having a small film thickness (preferably 50 angstroms or less) is formed on the aforementioned free magnetic layer 67. Subsequently, the non-magnetic layer 26 is formed on the aforementioned antiferromagnetic layer.

At this point in time, the aforementioned magnetic annealing is applied, and thereby, an exchange coupling magnetic field is generated between the aforementioned first antiferromagnetic layer 13 and the magnetic layer 14 constituting the pinned magnetic layer 64. At this time, since the aforementioned antiferromagnetic layer has a small film thickness, no exchange coupling magnetic field is generated between the free magnetic layer 67 and the antiferromagnetic layer arranged thereon, or even when generated, the exchange coupling magnetic field is not strong enough to cause the magnetization of the aforementioned free magnetic layer 67 to be pinned.

The aforementioned non-magnetic layer 26 is cut away by the aforementioned low energy ion milling. All the aforementioned non-magnetic layer 26 may be cut away at this time, and the antiferromagnetic layer arranged on the aforementioned free magnetic layer 67 may be exposed. However, if the aforementioned non-magnetic layer 26 is allowed to remain while having a film thickness of 3 angstroms or less, the aforementioned non-magnetic layer 26 may be allowed to remain on the aforementioned antiferromagnetic layer.

In the step shown in FIG. 23, another antiferromagnetic layer is formed on the aforementioned antiferromagnetic layer (or on the aforementioned non-magnetic layer 26 when a part of the non-magnetic layer 26 is allowed to remain) by sputtering, and a second antiferromagnetic layer 22 is constructed from the antiferromagnetic layer which has been arranged beforehand on the free magnetic layer 67 in the step shown in FIG. 22 and the antiferromagnetic layer arranged in the step shown in FIG. 23.

In the step shown in FIGS. 24 and 25, resist layers 50 are formed on both the edge sections A and the middle rear end B of the insulating layer 24. That is, the aforementioned resist layer is not formed on the middle front end C of the aforementioned insulating layer 24, and the aforementioned resist layers 50 are formed on the regions except for that.

In the step shown in FIGS. 24 and 25, the insulating layer 24 exposed at the middle front end C, not covered with the aforementioned resist layer 50, is cut away by RIE or ion milling, and furthermore, the second antiferromagnetic layer 22 under the aforementioned insulating layer 24 is cut away up to the position indicated by a dotted line M. At this time, the aforementioned second antiferromagnetic layer 22 is cut away until the film thickness F2 of the second antiferromagnetic layer 22 under the dotted line M becomes preferably 50 angstroms or less, and more preferably, 40 angstroms or less. Failure to do so results in that the middle front end C of the aforementioned second antiferromagnetic layer 22 keeps the antiferromagnetic property, an exchange coupling magnetic field is generated between the middle front end C of the aforementioned second antiferromagnetic layer 22 and the free magnetic layer 67 in the following step of the second magnetic annealing, and thereby, the magnetization of the middle front end C of the aforementioned free magnetic layer 67 is strongly pinned.

When the second antiferromagnetic layer 22 is cut partway as indicated by the dotted line M shown in FIG. 24 and FIG. 25, and a part of the second antiferromagnetic layer 22 is allowed to remain on the middle front end C of the free magnetic layer 67, the magnetic sensing element shown in FIG. 6 can be manufactured.

All of the second antiferromagnetic layer 22 on the aforementioned middle front end C may be removed, and the free magnetic layer 67 may be exposed at the aforementioned middle front end C. Alternatively, when the non-magnetic layer 26 is allowed to remain on the aforementioned free magnetic layer 67, up to the second antiferromagnetic layer 22 on the aforementioned non-magnetic layer 26 is cut away, and thereby the aforementioned non-magnetic layer 26 may be exposed at the aforementioned middle front end C. In this manner, the magnetic sensing element shown in FIG. 5 can be formed. As shown in FIG. 24, the free magnetic layer 67 of the aforementioned middle front end C may be somewhat cut away up to alternate long and short dashed lines N.

As shown in FIGS. 24 and 25, when inner edge surfaces 50a of the aforementioned resist layer 50 are formed into inclined surfaces or curved surfaces in order that the distance from the aforementioned middle front end C is gradually increased as the location on the inner edge surface 50a is changed from the bottom surface toward the top surface, inner side surfaces of the second antiferromagnetic layer 22 and the like of the aforementioned middle front end C cut away by ion milling or the like are formed into inclined surfaces or curved surfaces along the inner edge surfaces 50a of the aforementioned resist layer 50.

After the aforementioned RIE or ion milling step is completed, the resist layer 50 is removed, and furthermore, the second magnetic annealing is applied. The direction of the magnetic field at this time is the track-width direction (the X direction shown in the drawing). In this second magnetic annealing, the second applied magnetic field is made to be smaller than the exchange-anisotropic magnetic field of the first antiferromagnetic layer 13, and in addition, the heat treatment temperature is made to be lower than the blocking temperature of the aforementioned first antiferromagnetic layer 13. In this manner, the exchange-anisotropic magnetic fields of both the edge sections A and the middle rear end B of the aforementioned second antiferromagnetic layer 22 can be directed in the track-width direction (the X direction shown in the drawing) while the direction of the exchange-anisotropic magnetic field of the aforementioned first antiferromagnetic layer 13 is directed in the height direction (the Y direction shown in the drawing). The second heat treatment temperature is, for example, 250° C., and the magnitude of the magnetic field is 24 kA/m.

By the aforementioned second magnetic annealing, both the edge sections A and the middle rear end B of the aforementioned second antiferromagnetic layer 22 are transformed into ordered states, and a large exchange coupling magnetic field is generated between both the edge sections A and the middle rear end B of the aforementioned second antiferromagnetic layer 22 and both the edge sections A and the middle rear end B of the aforementioned free magnetic layer 67. In this manner, the magnetization of both the edge sections A and the middle rear end B of the aforementioned free magnetic layer 67 is pinned in the track-width direction (the X direction shown in the drawing). On the other hand, the magnetization of the middle front end C of the aforementioned free magnetic layer 67 is weakly brought into the condition of a single domain, so that magnetic reversal can be brought about with respect to an external magnetic field.

After the aforementioned magnetic annealing is applied, an upper electrode 30 (or an upper shield layer) is formed over the aforementioned insulating layer 24 and the free magnetic layer 67 (or on the second antiferromagnetic layer 22 in the case of the form shown in FIG. 6) of the middle front end C by plating or the like.

According to the aforementioned manufacturing method, the second antiferromagnetic layers 22 can be formed on both the edge sections A and the middle rear end B of the aforementioned free magnetic layer 67, and a proper magnitude of exchange coupling magnetic field can be generated between the aforementioned second antiferromagnetic layer 22 and the free magnetic layer 67. Consequently, both the edge sections A and the middle rear end B of the aforementioned free magnetic layer 67 can properly be magnetized, followed by pinning, turbulence in the magnetization of the middle front end C of the aforementioned free magnetic layer 67 can be alleviated, and a magnetic sensing element having small hysteresis can be manufactured.

A general manufacturing method of hard bias system may be applied to the magnetic sensing element shown in FIG. 7 to FIG. 9. The point different from the conventional method is that when the aforementioned hard bias layers 33 are formed, the hard bias layer 33 is also formed on the rear end surface side of the aforementioned multilayer film 35.

The magnetic sensing elements according to the present invention are not only usable for thin film magnetic heads mounted on hard disk devices, but also usable for magnetic heads for tapes, magnetic sensors and the like.

EXAMPLES

A magnetic sensing element for an experiment having a film configuration similar to that of the magnetic sensing element shown in FIG. 1 was prepared, and R-H curves (may be referred to as QST curves) were drawn using this magnetic sensing element.

The film configuration of the magnetic sensing element used for the experiment will be described below with reference to FIG. 1. In the magnetic sensing element for the experiment, a lower electrode made of Cr/Ta was used instead of the lower shield layer 10, and a seed layer 12 made of $(Ni_{0.8}Fe_{0.2})_{60\ at\ \%}Cr_{40\ at\ \%}$ (60 angstroms) was formed on this lower electrode. A first antiferromagnetic layer made of PtMn (150 angstroms), a pinned magnetic layer 64 composed of a laminated ferrimagnetic structure of $Co_{90\ at\ \%}Fe_{10\ at\ \%}$ (20 angstroms)/Ru (20 angstroms)/$Co_{90\ at\ \%}Fe_{10\ at\ \%}$ (30 angstroms), a non-magnetic material layer 18 made of Cu (25 angstroms) land a free magnetic layer 67 composed of a single-layer structure of CoFe (50 angstroms) were formed on the aforementioned seed layer 12. Furthermore, as shown in FIG. 2, a second antiferromagnetic layers 22 made of PtMn (300 angstroms) and an insulating layer 24 made of $Al_2O_3$ (500 angstroms) were formed on both the edge sections A and the middle rear end B, except for the middle front end C, of the aforementioned ferromagnetic layer 67, and an upper electrode made of Ti/Au was formed over the aforementioned insulating layer 24 and the middle front end C of the aforementioned free magnetic layer 67.

The width dimension (that is, the track width Tw) of the middle front end C of the aforementioned free magnetic layer 67 in the track-width direction (the X direction shown in the drawing) shown in FIG. 2 was specified to be 0.25 μm, and the length direction Li (referred to as MR height) of the aforementioned middle front end C in the height direction (the Y direction shown in the drawing) was specified to be 0.30 μm.

The free magnetic layer 67 was magnetized in the leftward direction shown in the drawing parallel to the track-width direction (the X direction shown in the drawing), and the pinned magnetic layer 64 was magnetized in the height direction (the Y direction shown in the drawing). Sense current was flowed between the upper electrode and the lower electrode from the seed layer into the multilayer film of the free magnetic layer in the film thickness direction.

In the experiment, the sense current was set at 10 mA (a sense current density of 13 MA/cm$^2$), 20 mA (a sense current density of 27 MA/cm$^2$) or 30 mA (a sense current density of 40 MA/cm$^2$), and an R-H curve was drawn with respect to each magnitude of the sense current.

Figure 26:
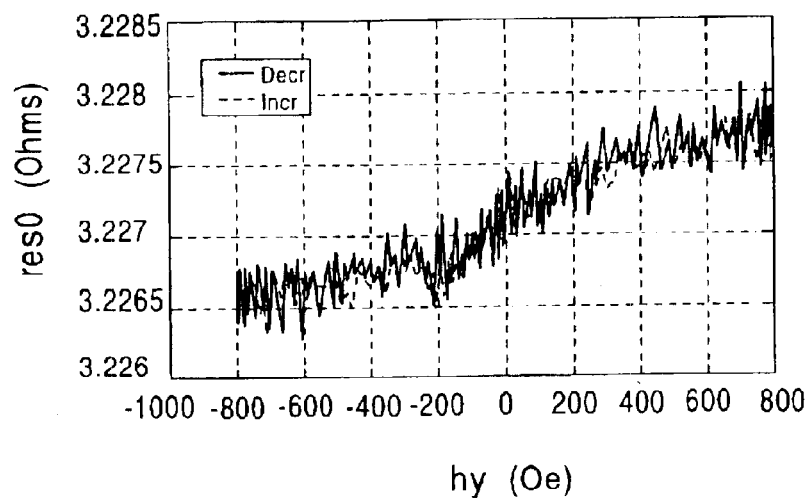
FIG. 26 is a diagram showing an R-H curve resulting from an experiment performed using a magnetic sensing element in an example at a sense current of 10 mA (a sense current density of 13 MA/cm$^2$).
Figure 27:
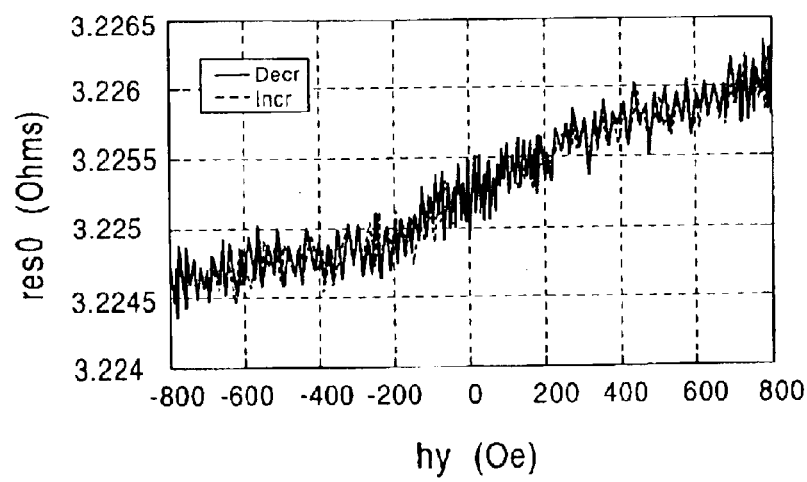
FIG. 27 is a diagram showing an R-H curve resulting from an experiment performed using a magnetic sensing element in an example at a sense current of 20 mA (a sense current density of 27 MA/cm$^2$).
Figure 28:
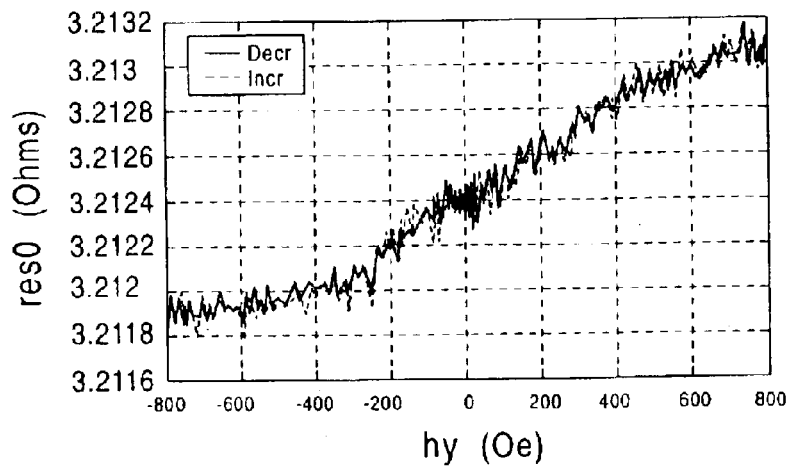
FIG. 28 is a diagram showing an R-H curve resulting from an experiment performed using a magnetic sensing element in an example at a sense current of 30 mA (a sense current density of 40 MA/cm$^2$).

The experimental results thereof are shown in FIG. 26 to FIG. 28. FIG. 26 is a diagram showing an R-H curve resulting from the experiment performed at a sense current of 10 mA (a sense current density of 13 MA/cm$^2$), FIG. 27 is a diagram showing an R-H curve resulting from the experiment performed at a sense current of 20 mA (a sense current density of 27 MA/cm$^2$), and FIG. 28 is a diagram showing an R-H curve resulting from the experiment performed at a sense current of 30 mA (a sense current density of 40 MA/cm$^2$).

As is clear from the experimental results shown in FIG. 26 to FIG. 28, almost no hysteresis is observed. In particular, even when the sense current is increased (that is, even when the sense current density is increased), the R-H curves do not significantly change. Consequently, it is clear that according to the structure of the magnetic sensing element of the present invention, the magnetic sensing element having no hysteresis can be manufactured even when the sense current is increased.

Figure 29:
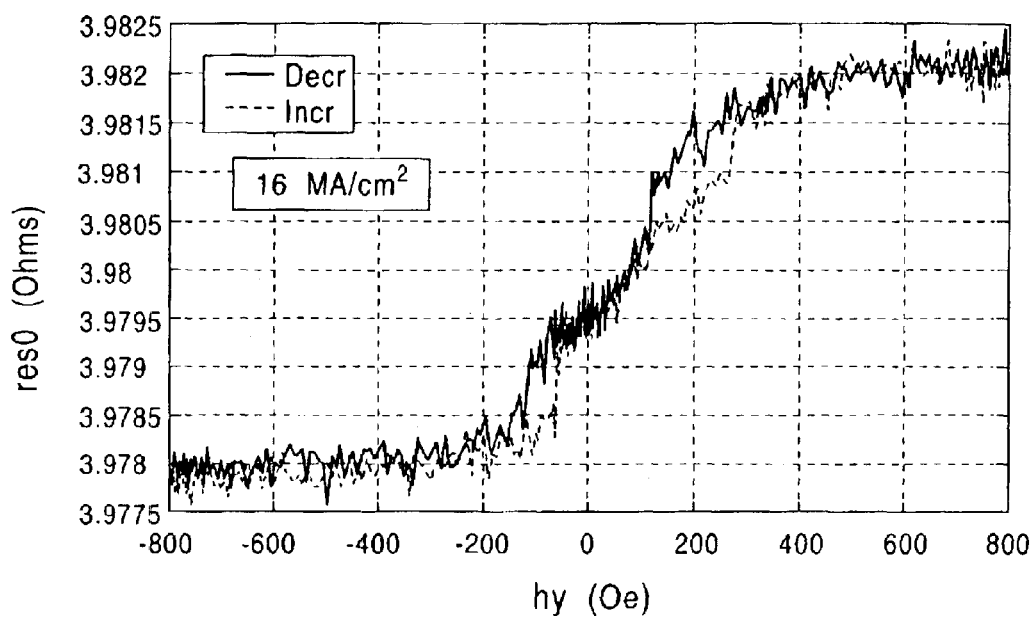
FIG. 29 is a diagram showing an R-H curve resulting from an experiment performed using a magnetic sensing element in a comparative example at a sense current density of 16 MA/cm$^2$.
Figure 30:
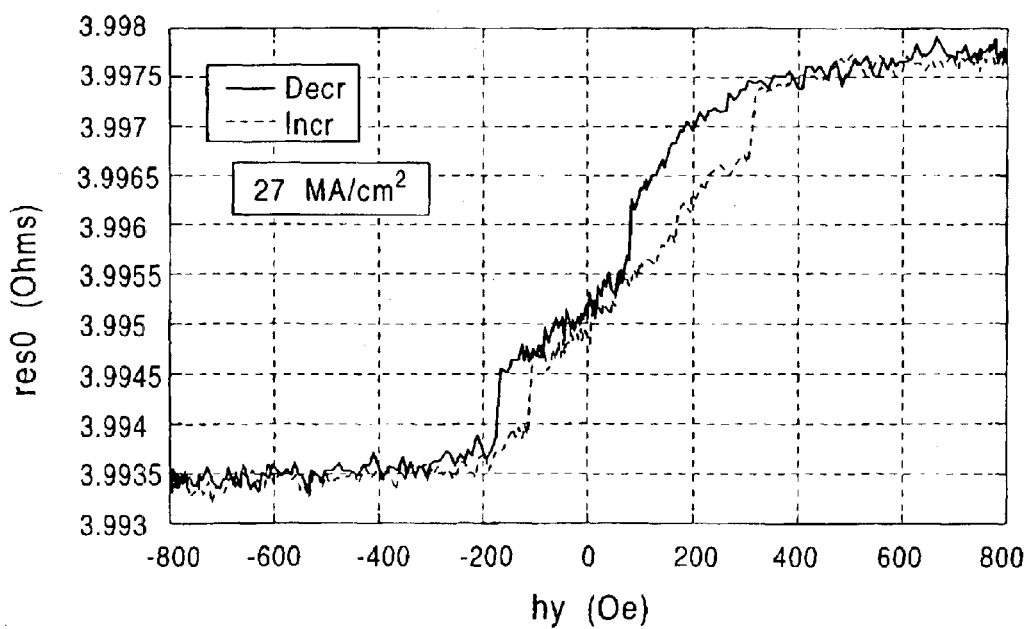
FIG. 30 is a diagram showing an R-H curve resulting from an experiment performed using a magnetic sensing element in a comparative example at a sense current density of 27 MA/cm$^2$.
Figure 31:
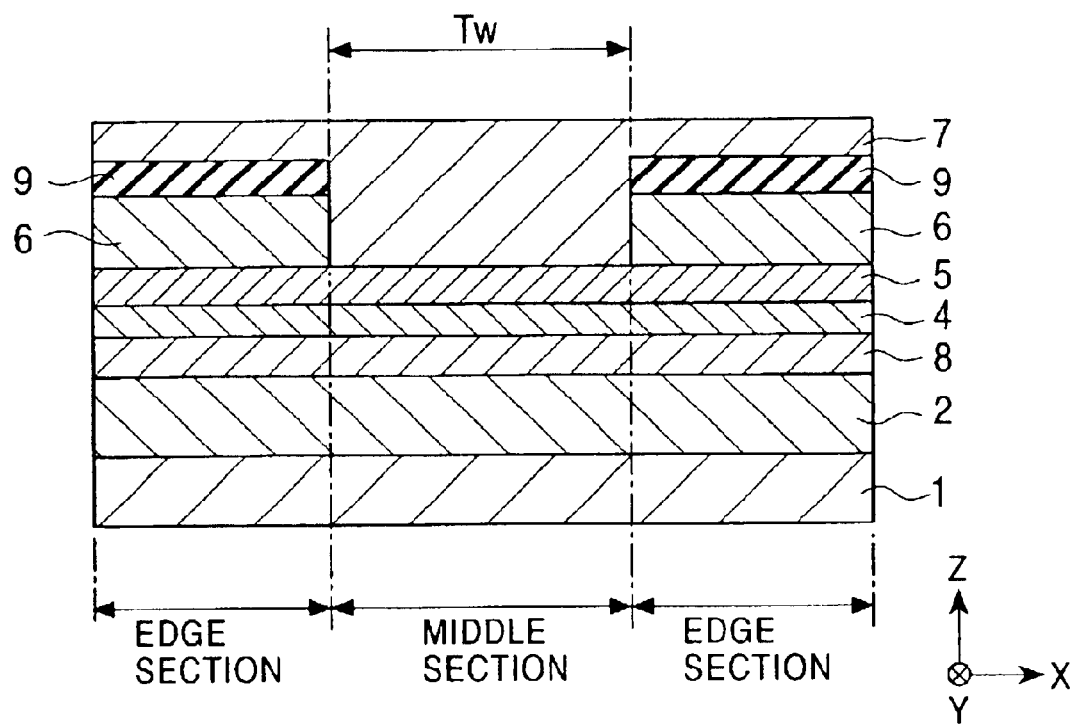
FIG. 31 is a partial sectional view of the structure of a conventional magnetic sensing element, viewed from the side of the surface facing a recording medium.
Figure 32:
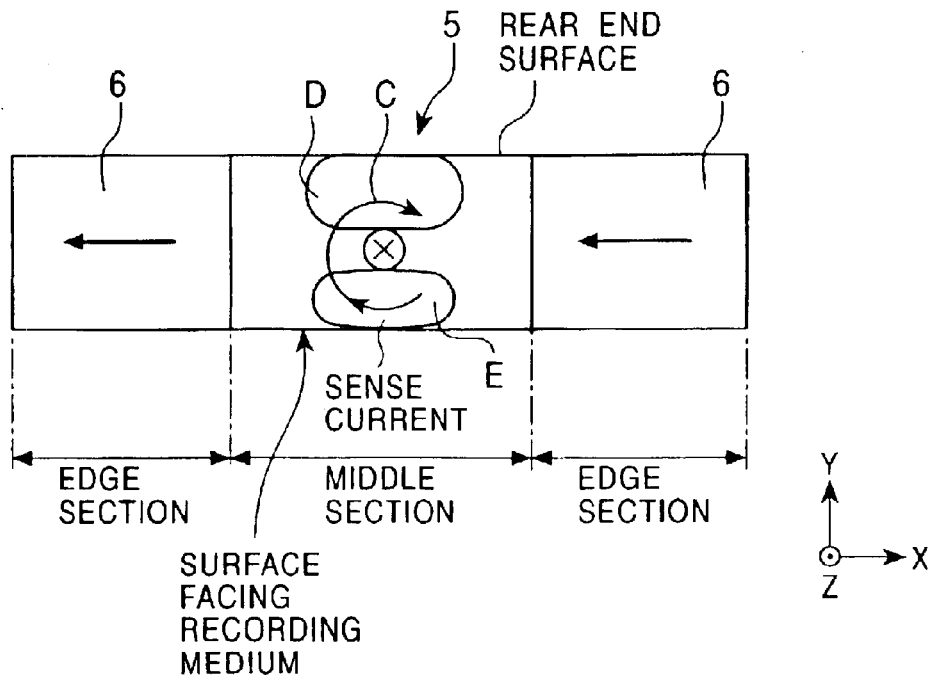
FIG. 32 is a partial plan view of the free magnetic layer and the second antiferromagnetic layers shown in FIG. 31, viewed from directly above.
Figure 33:
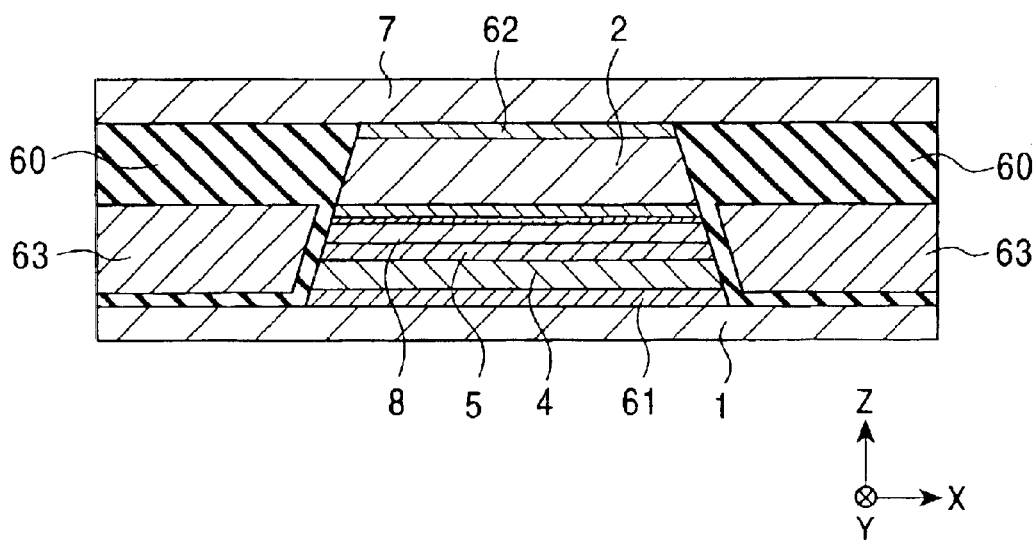
FIG. 33 is a partial sectional view of the structure of another conventional magnetic sensing element, viewed from the side of the surface facing a recording medium.

On the other hand, the experimental results (comparative examples) shown in FIG. 29 and FIG. 30 are R-H curves resulting from the experiments performed using a conventional magnetic sensing element having the film structure shown in FIG. 33 and FIG. 34.

The magnetic sensing element shown in FIG. 33 and FIG. 34 had a structure in which magnetization control of the free magnetic layer was performed using the hard bias layer. In the magnetic sensing element used for the experiment, the track width Tw was specified to be 0.25 μm, the length dimension in the height direction (MR height) was specified to be 0.30 μm, and Mr×r (residual magnetization×film thickness) of the hard bias layer/Ms×r (saturation magnetization×film thickness) of the free magnetic layer was specified to be 3.1.

The experiments were performed at sense current densities of 16 MA/cm$^2$ and 27 MA/cm$^2$, and R-H curves were drawn. FIG. 29 is a diagram showing the R-H curve resulting from the experiment performed at a sense current density of 16 MA/cm$^2$, and FIG. 30 is a diagram showing the R-H curve resulting from the experiment performed at a sense current density of 27 MA/cm$^2$.

As shown in FIG. 29 and FIG. 30, both curves have hysteresis. In particular, it is clear that the hysteresis in the experimental result shown in FIG. 30, in which the sense current density is large, is larger than that shown in FIG. 29. The R-H curve shown in FIG. 30 is the result from the experiment at the same sense current density as that of the R-H curve in the example shown in FIG. 27. It is clear that no hysteresis is observed in the example shown in FIG. 27, while large hysteresis is observed in the comparative example shown in FIG. 30.

As is clear from the aforementioned experimental results, when the second antiferromagnetic layers are provided not only on both edge sections of the free magnetic layer, but also on the middle rear end, according to the present invention, turbulence in the magnetization of the free magnetic layer due to the sense current magnetic field can be properly alleviated, and a magnetic sensing element having small hysteresis can be manufactured.

According to the present invention described above in detail, the second antiferromagnetic layers are provided not only on both the edge sections of the free magnetic layer in the track-width direction, but also on the middle rear end of the aforementioned free magnetic layer.

In the present invention, a sense current magnetic field in the direction opposite to the magnetization direction of the aforementioned free magnetic layer is cancelled by the bias magnetic field from the second antiferromagnetic layer provided on the middle rear end of the free magnetic layer in the height-side edge of the middle front end of the aforementioned free magnetic layer. Consequently, an influence of the aforementioned sense current magnetic field can be reduced, turbulence in the magnetization of the aforementioned free magnetic layer can be made smaller than ever, the magnetization control of the aforementioned free magnetic layer can be properly performed, and a magnetic sensing element having hysteresis smaller than ever can be manufactured.

In the present invention, the hard bias layers are provided facing both the edge surfaces and rear end surface of the free magnetic layer. Even when the aforementioned hard bias layer is arranged in contact with the rear end surface of the aforementioned free magnetic layer, pinning of the magnetization in the vicinity of the rear end surface of the aforementioned free magnetic layer can be enhanced by the exchange interaction with the aforementioned hard, bias layer. Consequently, the sense current magnetic field in the direction opposite to the magnetization direction of the aforementioned free magnetic layer can be cancelled, influence of the aforementioned sense current magnetic field can be weakened, and turbulence in the magnetization of the aforementioned free magnetic layer can be made smaller than ever.

What is claimed is:

1. A magnetic sensing element in which a multilayer film comprising a first antiferromagnetic layer, a pinned magnetic layer, a non-magnetic material layer and a free magnetic layer in that order from the bottom is provided, an upper electrodes is provided above the multilayer film, a lower electrode is provided under the multilayer film, and electric current flows in a direction perpendicular to a film surface of each layer of the multilayer film, wherein a second antiferromagnetic layers is provided on edge sections in a track-width direction of the free magnetic layer and on a rear end of a middle section in the track-width direction of the free magnetic layer, and wherein the upper electrode is provided on a front end of the middle section of the free magnetic layer and the second antiferromagnetic layer is provided in a region excluding the front end of the middle section.

2. The magnetic sensing element according to claim 1, wherein the second antiferromagnetic layers provided on the edge sections and on the middle rear end is integrally arranged.

3. The magnetic sensing element according to claim 1, wherein an insulating layer is provided on the second antiferromagnetic layer, and the upper electrode is arranged over the insulating layer and a middle front end of the free magnetic layer.

4. The magnetic sensing element according to claim 3, wherein the insulating layer is arranged extending onto a part of the middle front end of the free magnetic layer, and the upper electrode is arranged over the insulating layer and the middle front end of the free magnetic layer, not covered with the insulating layer.

5. The magnetic sensing element according to claim 1, wherein the non-magnetic material layer is formed from a non-magnetic conductive material.

6. The magnetic sensing element according to claim 1, wherein the non-magnetic material layer is formed from an insulating material.

7. The magnetic sensing element according to claim 1, wherein the lower electrode is a lower shield layer, and the upper electrode arranged above the multilayer film is an upper shield layer.

8. A magnetic sensing element in which a multilayer film comprising a first antiferromagnetic layer, a pinned magnetic layer, a non-magnetic material layer and a free magnetic layer is provided, an upper electrodes is provided above the multilayer film, a lower electrode is provided under the multilayer film, and electric current flows in a direction perpendicular to a film surface of each layer of the multilayer film, wherein a bias layers is provided facing edge surfaces in a track-width direction of the free magnetic layer and a rear end surface in a height direction, and the bias layer provided on a rear end surface side is arranged in contact with a middle section of the rear end surface of the free magnetic layer, and wherein the upper electrode is provided on the free magnetic layer and the bias layer is provided in a region excluding a front end middle section of the free magnetic layer.

9. The magnetic sensing element according to claim 8, wherein the bias layers provided on the edge surfaces and on the rear end surface is integrally arranged.

10. The magnetic sensing element according to claim 8, wherein an insulating layer is provided on the bias layer, and the upper electrode is arranged over the insulating layer and the free magnetic layer.

11. The magnetic sensing element according to claim 8, wherein the non-magnetic material layer is formed from a non-magnetic conductive material.

12. The magnetic sensing element according to claim 8, wherein the non-magnetic material layer is formed from an insulating material.

13. The magnetic sensing element according to claim 8, wherein the lower electrode is a lower shield layer, and the upper electrode arranged above the multilayer film is an upper shield layer.

14. A magnetic sensing element in which a multilayer film comprising a first antiferromagnetic layer, a pinned magnetic layer, a non-magnetic material layer and a free magnetic layer in that order from the bottom is provided, an upper electrode is provided above the multilayer film, a lower electrode is provided under the multilayer film, and electric current flows in a direction perpendicular to a film surface of each layer of the multilayer film, wherein a second antiferromagnetic layer is provided on edge sections in a track-width direction of the free magnetic layer and on a rear end of a middle section in the track-width direction of the free magnetic layer, an insulating layer is provided on the second antiferromagnetic layer, and wherein the upper electrode is arranged over the insulating layer and a part of a middle front end of the free magnetic layer not covered with the insulating layer.

15. The magnetic sensing element according to claim 14, wherein the second antiferromagnetic layer provided on the edge sections and on the middle rear end is integrally arranged.

16. The magnetic sensing element according to claim 14, wherein the non-magnetic material layer is formed from a non-magnetic conductive material.

17. The magnetic sensing element according to claim 14, wherein the non-magnetic material layer is formed from an insulating material.

18. The magnetic sensing element according to claim 14, wherein the lower electrode is a lower shield layer, and the upper electrode arranged above the multilayer film is an upper shield layer.

* * * * *